US011402756B2

(12) United States Patent
Maruyama et al.

(10) Patent No.: US 11,402,756 B2
(45) Date of Patent: *Aug. 2, 2022

(54) SILICONE STRUCTURE-CONTAINING POLYMER, PHOTOSENSITIVE RESIN COMPOSITION, PHOTOSENSITIVE RESIN COATING, PHOTOSENSITIVE DRY FILM, LAMINATE, AND PATTERN FORMING PROCESS

(71) Applicant: Shin-Etsu Chemical Co., Ltd., Tokyo (JP)

(72) Inventors: Hitoshi Maruyama, Annaka (JP); Kazunori Kondo, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 471 days.

This patent is subject to a terminal disclaimer.

(21) Appl. No.: 16/056,711

(22) Filed: Aug. 7, 2018

(65) Prior Publication Data

US 2019/0049844 A1 Feb. 14, 2019

(30) Foreign Application Priority Data

Aug. 9, 2017 (JP) .............................. JP2017-153884

(51) Int. Cl.
| | |
|---|---|
| *G03F 7/075* | (2006.01) |
| *G03F 7/038* | (2006.01) |
| *G03F 7/40* | (2006.01) |
| *C08G 77/52* | (2006.01) |
| *C08G 77/54* | (2006.01) |
| *G03F 7/004* | (2006.01) |
| *G03F 7/11* | (2006.01) |
| *G03F 7/16* | (2006.01) |
| *G03F 7/20* | (2006.01) |
| *G03F 7/32* | (2006.01) |
| *G03F 7/38* | (2006.01) |
| *H01L 23/00* | (2006.01) |

(52) U.S. Cl.
CPC ........... *G03F 7/0757* (2013.01); *C08G 77/52* (2013.01); *C08G 77/54* (2013.01); *G03F 7/0045* (2013.01); *G03F 7/038* (2013.01); *G03F 7/11* (2013.01); *G03F 7/16* (2013.01); *G03F 7/168* (2013.01); *G03F 7/2004* (2013.01); *G03F 7/325* (2013.01); *G03F 7/38* (2013.01); *H01L 24/29* (2013.01); *H01L 24/83* (2013.01); *G03F 7/40* (2013.01); *H01L 2224/29191* (2013.01); *H01L 2224/83948* (2013.01)

(58) Field of Classification Search
CPC . G03F 7/0757; G03F 7/38; G03F 7/40; C08G 77/52
See application file for complete search history.

(56) References Cited

U.S. PATENT DOCUMENTS

| | | | |
|---|---|---|---|
| 4,470,831 A | 9/1984 | Hirose | |
| 4,990,546 A | 2/1991 | Eckberg | |
| 5,240,971 A | 8/1993 | Eckberg et al. | |
| 5,346,980 A | 9/1994 | Babu | |
| 5,750,589 A | 5/1998 | Zech et al. | |
| 6,072,016 A | 6/2000 | Kobayashi et al. | |
| 6,590,010 B2 | 7/2003 | Kato et al. | |
| 7,785,766 B2* | 8/2010 | Kato ....................... | C08G 77/52 430/270.1 |
| 8,697,333 B2 | 4/2014 | Soga et al. | |
| 8,715,905 B2 | 5/2014 | Tagami et al. | |
| 8,729,148 B2 | 5/2014 | Asai et al. | |
| 8,796,410 B2* | 8/2014 | Sugo ..................... | H01L 23/296 528/35 |
| 8,889,810 B2 | 11/2014 | Takeda et al. | |
| 9,012,111 B2 | 4/2015 | Asai et al. | |
| 9,091,919 B2 | 7/2015 | Urano et al. | |
| 9,122,158 B2 | 9/2015 | Asai | |
| 10,503,067 B2* | 12/2019 | Maruyama .............. | C08L 83/04 |
| 10,982,053 B2 | 4/2021 | Maruyama et al. | |
| 2008/0182087 A1 | 7/2008 | Kato et al. | |
| 2009/0156753 A1 | 6/2009 | Sugo et al. | |
| 2011/0061914 A1 | 3/2011 | Sekito | |
| 2011/0076465 A1 | 3/2011 | Takeda et al. | |
| 2011/0077364 A1 | 3/2011 | Tazaki et al. | |
| 2011/0275768 A1 | 11/2011 | Yasuda et al. | |
| 2012/0108762 A1* | 5/2012 | Kondo ................ | H01L 21/6836 525/476 |
| 2012/0235284 A1 | 9/2012 | Sugo et al. | |
| 2013/0029145 A1 | 1/2013 | Kato et al. | |

(Continued)

FOREIGN PATENT DOCUMENTS

| | | |
|---|---|---|
| EP | 0927736 A1 | 7/1999 |
| EP | 1186624 B1 | 3/2003 |

(Continued)

OTHER PUBLICATIONS

Search Report dated Dec. 19, 2018, issued in counterpart EP Application No. 18187705.1 (9 pages).
Extended European Search Report dated Sep. 20, 2019, issued in counterpart EP application No. 19172966.4. (8 pages).
Non-Final Office Action dated Aug. 24, 2020, issued in U.S. Appl. No. 16/414,281 (16 pages).
Li et a. "Synthesis and Properties of Polymers Containing Siphenylene Moiety via Catalytic Cross-Dehydrocoupling Polymerization of 1,4-Bis(dimethylsilyl)benzene" Macromolecules, 1999, 32, 8768-8773. (Year:1999) (6 pages).

(Continued)

*Primary Examiner* — John S Chu
(74) *Attorney, Agent, or Firm* — WHDA, LLP

(57) ABSTRACT

A photosensitive resin composition comprising a silicone structure-containing polymer having crosslinking groups or crosslinking reaction-susceptible reactive sites in the molecule is coated onto a substrate to form a photosensitive resin coating which has improved substrate adhesion, a pattern forming ability, crack resistance, heat resistance, and reliability as protective film.

20 Claims, No Drawings

(56) References Cited

U.S. PATENT DOCUMENTS

| | | |
|---|---|---|
| 2013/0108866 A1 | 5/2013 | Kato et al. |
| 2013/0108876 A1 | 5/2013 | Komori et al. |
| 2013/0135763 A1 | 5/2013 | Liao et al. |
| 2013/0149645 A1 | 6/2013 | Takemura et al. |
| 2013/0196114 A1 | 8/2013 | Urano et al. |
| 2013/0302983 A1 | 11/2013 | Tanabe et al. |
| 2013/0323631 A1 | 12/2013 | Asai et al. |
| 2016/0033865 A1 | 2/2016 | Takemura et al. |
| 2016/0097973 A1 | 4/2016 | Urano et al. |
| 2016/0315025 A1 | 10/2016 | Kondo et al. |
| 2017/0198102 A1 | 7/2017 | Yanaizumi et al. |
| 2017/0255097 A1 | 9/2017 | Takemura et al. |
| 2018/0004088 A1 | 1/2018 | Maruyama et al. |
| 2018/0224743 A1 | 8/2018 | Maruyama et al. |
| 2019/0049844 A1 | 2/2019 | Maruyama et al. |
| 2019/0354014 A1 | 11/2019 | Maruyama et al. |
| 2020/0165364 A1 | 5/2020 | Higuchi |
| 2020/0165394 A1 | 5/2020 | Maruyama et al. |
| 2020/0201182 A1 | 6/2020 | Hirano et al. |

FOREIGN PATENT DOCUMENTS

| | | |
|---|---|---|
| EP | 1953183 A2 | 8/2008 |
| EP | 1953183 A3 | 11/2008 |
| EP | 2447304 A1 | 5/2012 |
| EP | 2587530 A2 | 5/2013 |
| EP | 1953183 B1 | 9/2013 |
| EP | 2397508 B1 | 2/2016 |
| EP | 3103835 A1 | 12/2016 |
| EP | 3211661 A2 | 8/2017 |
| EP | 3 214 497 A1 | 9/2017 |
| EP | 3 358 412 A1 | 8/2018 |
| JP | 8-32763 B2 | 3/1996 |
| JP | H11-80362 A | 3/1999 |
| JP | 2002-88158 A | 3/2002 |
| JP | 2008-184571 A | 8/2008 |
| JP | 2012-1668 A | 1/2012 |
| JP | 2012-092268 A | 5/2012 |
| JP | 2013-110391 A | 6/2013 |
| JP | 2013-173920 A | 9/2013 |
| JP | 2014-122276 A | 7/2014 |
| JP | 2016-74874 A | 5/2016 |
| JP | 2016-125032 A | 7/2016 |
| JP | 2018-002848 A | 1/2018 |
| JP | 2018-124552 A | 8/2018 |
| WO | 2016/076205 A1 | 5/2016 |

OTHER PUBLICATIONS

Office Action dated Sep. 1, 2020, issued in counterpart JP Application No. 2017-153884, with English Translation. (18 pages).

Non-Final Office Action dated Jun. 10, 2021, issued in U.S. Appl. No. 16/411,472 (18 pages).

Non-Final Office Action dated Jun. 10, 2021, issued in U.S. Appl. No. 16/676,591 (18 pages).

Non-Final Office Action dated Jun. 24, 2021, issued in U.S. Appl. No. 16/716,821 (17 pages).

Extended European Search Report dated Dec. 20, 2018, issued in EP Application No. 18187713.5 (counterpart to U.S. Appl. No. 16/056,629: (7 pages).

Notice of Reasons for Refusal dated Aug. 25, 2020, issued in JP Application No. 2017-153901 (counterpart to U.S. Appl. No. 16/056,629: with English translation. (8 pages).

Non-Final Office Action dated Sep. 18, 2020, issued in U.S. Appl. No. 16/056,629 (16 pages).

Non-Final Office Action dated May 22, 2019, issued in U.S. Appl. No. 15/883,265 (9 pages).

Non-Final Action dated Sep. 14, 2021, issued in U.S. Appl. No. 16/056,629 (12 pages).

Final Office Action dated Mar. 11, 2022, issued in U.S. Appl. No. 16/056,629. (19 pages).

* cited by examiner

SILICONE STRUCTURE-CONTAINING POLYMER, PHOTOSENSITIVE RESIN COMPOSITION, PHOTOSENSITIVE RESIN COATING, PHOTOSENSITIVE DRY FILM, LAMINATE, AND PATTERN FORMING PROCESS

CROSS-REFERENCE TO RELATED APPLICATION

This non-provisional application claims priority under 35 U.S.C. § 119(a) on Patent Application No. 2017-153884 filed in Japan on Aug. 9, 2017, the entire contents of which are hereby incorporated by reference.

TECHNICAL FIELD

This invention relates to a silicone structure-containing polymer, a photosensitive resin composition, a photosensitive resin coating, a photosensitive dry film, and a pattern forming process using the composition or dry film, and a laminate using the coating.

BACKGROUND ART

In the prior art, photosensitive protective films for semiconductor devices and photosensitive insulating films for multilayer printed circuit boards are formed of photosensitive polyimide compositions, photosensitive epoxy resin compositions, photosensitive silicone compositions, and the like. As the photosensitive material applied for the protection of such substrates and circuits, Patent Document 1 discloses a photosensitive silicone composition. This photosensitive silicone composition is curable at low temperature and forms a coating which is flexible and fully reliable with respect to moisture resistant adhesion and other properties, but is less resistant against chemicals such as photoresist strippers having a high dissolving power, typically N-methyl-2-pyrrolidone (NMP).

To overcome the problem, Patent Document 2 proposes a photosensitive silicone composition based on a silphenylene structure-containing silicone polymer. This composition is improved in chemical resistance against photoresist strippers and the like, but still has the problem that the cured coating peels from the substrate or cracks in a thermal cycling test (repeating 1,000 cycles a test of holding at −25° C. for 10 minutes and holding at 125° C. for 10 minutes). A further improvement in the reliability of such resin compositions is desired.

CITATION LIST

Patent Document 1: JP-A 2002-088158 (U.S. Pat. No. 6,590,010, EP 1186624)
Patent Document 2: JP-A 2008-184571 (U.S. Pat. No. 7,785,766, EP 1953183)

DISCLOSURE OF INVENTION

An object of the invention is to provide a silicone structure-containing polymer, a photosensitive resin composition, a photosensitive resin coating, and a photosensitive dry film, which form a resin coating or resin layer that can be processed in thick film form to define a fine size pattern, has improved film properties including crack resistance and adhesion to substrates for use in electronic parts and semiconductor devices and supports for use in circuit boards, and is thus reliable as a protective film for electric and electronic parts and a film for bonding substrates. Another object is to provide a laminate and a pattern forming process using the foregoing.

The inventors have found that a silicone structure-containing polymer having crosslinking groups or crosslinking reaction-susceptible reactive sites in the molecule functions to provide a sufficient film-forming ability; that from a composition comprising the polymer, a photosensitive resin coating can be formed to a wide range of thickness; and that the photosensitive resin coating has improved adhesion to substrates, electronic parts and semiconductor devices, a pattern forming ability, crack resistance, heat resistance, electric insulation, and reliability as insulating protective film, and is thus useful as a protective film for electric and electronic parts and a film for bonding substrates.

In one aspect, the invention provides a silicone structure-containing polymer comprising recurring units having the formula (a1) and recurring units having the formula (b1).

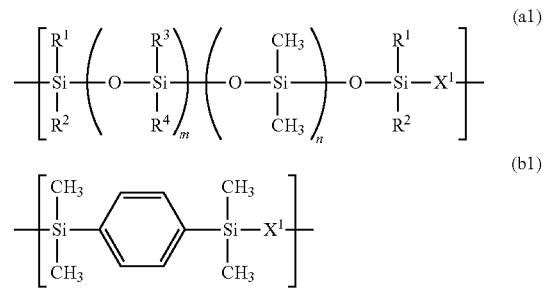

Herein $R^1$ to $R^4$ are each independently a $C_1$-$C_8$ monovalent hydrocarbon group, m and n are each independently an integer of 0 to 300, $X^1$ is a divalent group having the formula (1):

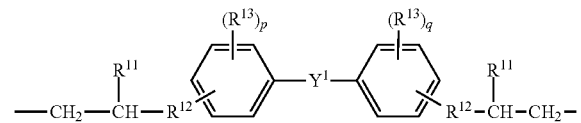

wherein $R^{11}$ is each independently hydrogen or a $C_1$-$C_8$ monovalent hydrocarbon group in which at least one hydrogen may be substituted by halogen, $R^{12}$ is each independently a $C_1$-$C_8$ straight, branched or cyclic alkylene group in which any methylene moiety may be substituted by an ether bond or phenylene moiety, $R^{13}$ is each independently hydrogen, a $C_1$-$C_8$ monovalent hydrocarbon group, hydroxyl group or glycidyl group, p and q are each independently an integer of 0 to 4, $Y^1$ is a single bond or a divalent organic group having the formula (1-1), (1-2) or (1-3):

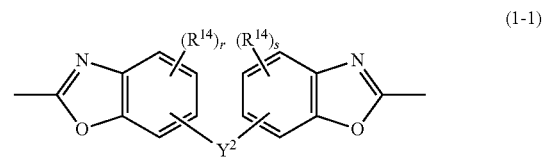

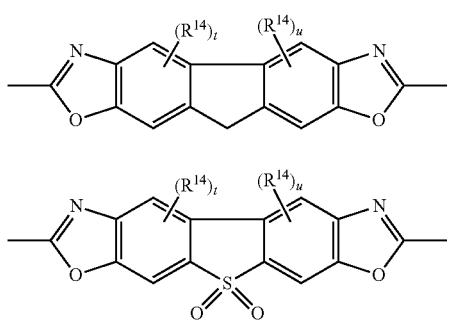

wherein $R^{14}$ is a $C_1$-$C_8$ monovalent hydrocarbon group in which at least one hydrogen may be substituted by halogen, $Y^2$ is a divalent organic group, r and s are each independently an integer of 0 to 3, t and u are each independently an integer of 0 to 2.

In a preferred embodiment, $Y^2$ is a group selected from the following groups:

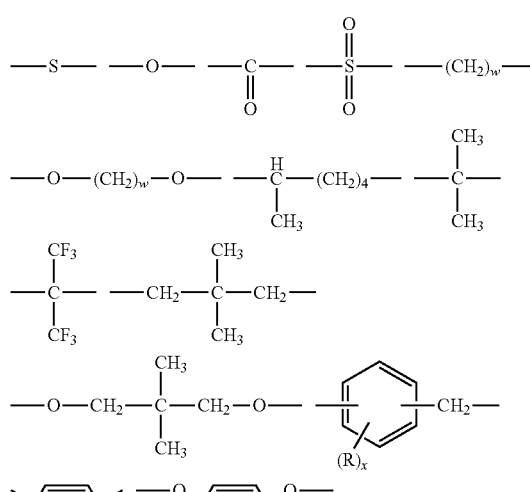

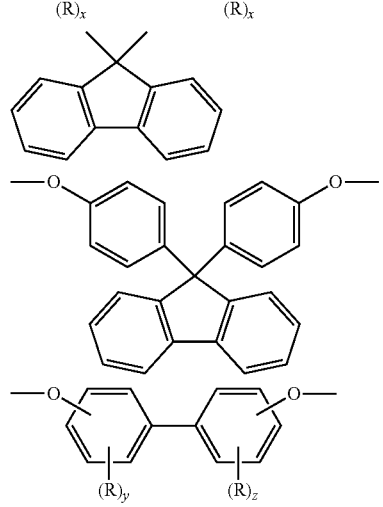

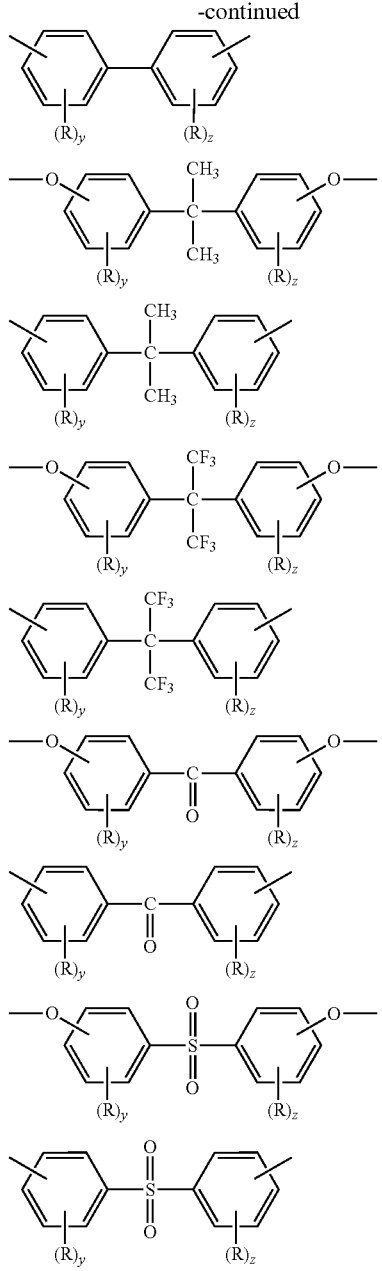

wherein R is each independently halogen, or a $C_1$-$C_8$ straight, branched or cyclic alkyl or haloalkyl group, w is an integer of 1 to 6, x is an integer of 0 to 4, and y and z are each independently an integer of 0 to 4.

In a preferred embodiment, the silicone structure-containing polymer may further comprise recurring units having the formula (a2) and recurring units having the formula (b2).

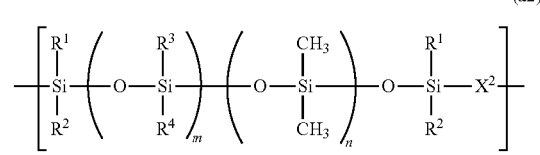

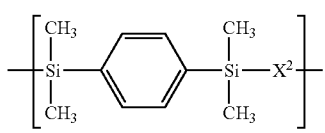
(b2)

Herein $R^1$ to $R^4$, m and n are as defined above, $X^2$ is a divalent group having the formula (2):

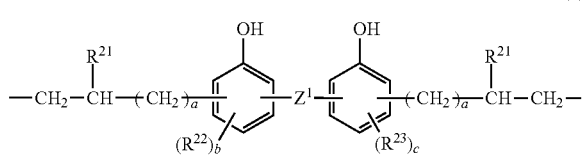
(2)

wherein $Z^1$ is a single bond or a divalent organic group selected from the following:

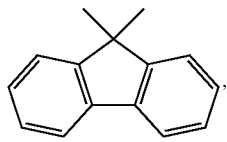
, and $R^{21}$ is each independently hydrogen or methyl, $R^{22}$ and $R^{23}$ are each independently a $C_1$-$C_4$ straight, branched or cyclic alkyl group or a $C_1$-$C_4$ straight, branched or cyclic alkoxy group, a is each independently an integer of 0 to 7, b and c are each independently an integer of 0 to 2.

In a preferred embodiment, the silicone structure-containing polymer may further comprise recurring units having the formula (a3) and recurring units having the formula (b3).

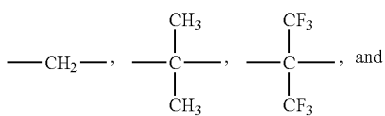
(a3)

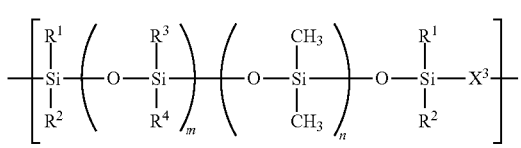
(b3)

Herein $R^1$ to $R^4$, m and n are as defined above, $X^3$ is a divalent group having the formula (3):

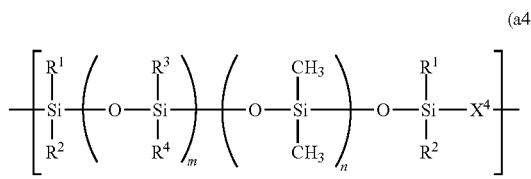
(3)

wherein $Z^2$ is a single bond or a divalent organic group selected from the following:

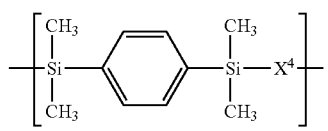
, and $R^{31}$ is each independently hydrogen or methyl, $R^{32}$ and $R^{33}$ are each independently a $C_1$-$C_4$ straight, branched or cyclic alkyl group or a $C_1$-$C_4$ straight, branched or cyclic alkoxy group, d is each independently an integer of 0 to 7, e and f are each independently an integer of 0 to 2.

In a preferred embodiment, the silicone structure-containing polymer may further comprise recurring units having the formula (a4) and recurring units having the formula (b4).

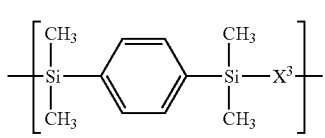
(a4)

(b4)

Herein $R^1$ to $R^4$, m and n are as defined above, $X^4$ is a divalent group having the formula (4):

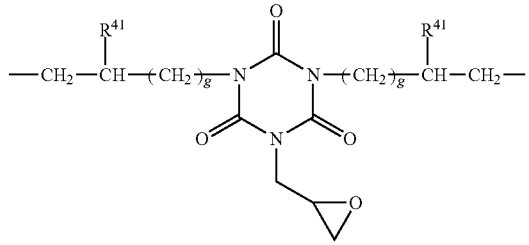
(4)

wherein $R^{41}$ is each independently hydrogen or methyl, and g is each independently an integer of 0 to 7.

In a preferred embodiment, the silicone structure-containing polymer may further comprise recurring units having the formula (a5) and recurring units having the formula (b5).

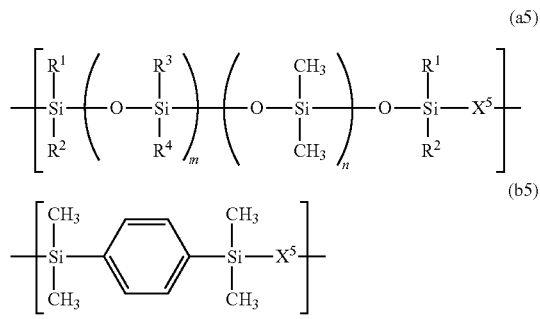

Herein $R^1$ to $R^4$, m and n are as defined above, $X^5$ is a divalent group having the formula (5):

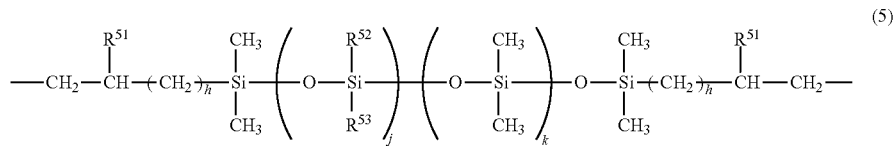

wherein $R^{51}$ is each independently hydrogen or methyl, $R^{52}$ and $R^{53}$ are each independently a $C_1$-$C_8$ monovalent hydrocarbon group, j and k are each independently an integer of 0 to 300, and h is each independently an integer of 0 to 7.

In a second aspect, the invention provides a photosensitive resin composition comprising (A) a base resin containing the silicone structure-containing polymer defined above and (B) a photoacid generator.

The photosensitive resin composition may further comprise (C) a crosslinker. The crosslinker (C) is preferably at least one compound selected from among an amino condensate modified with formaldehyde or formaldehyde-alcohol, a phenol compound having on the average at least two methylol or alkoxymethylol groups in the molecule, and an epoxy compound having on the average at least two epoxy groups in the molecule.

The photosensitive resin composition may further comprise (D) a solvent and/or (E) a basic compound.

In a third aspect, the invention provides a photosensitive resin coating formed of the photosensitive resin composition defined above.

In a fourth aspect, the invention provides a photosensitive dry film comprising a support film and the photosensitive resin coating thereon.

In a fifth aspect, the invention provides a laminate comprising a substrate having grooves and/or holes having an opening width of 10 to 100 µm and a depth of 10 to 120 µm and the photosensitive resin coating thereon.

In a sixth aspect, the invention provides a pattern forming process comprising the steps of:
(i) coating the photosensitive resin composition defined above onto a substrate to form a photosensitive resin coating thereon,
(ii) exposing a predetermined region of the photosensitive resin coating to radiation through a photomask and post-exposure baking, and
(iii) developing the photosensitive resin coating as post-exposure baked in a developer to dissolve away the unexposed region of the resin coating and to form a pattern of the resin coating.

In a seventh aspect, the invention provides a pattern forming process comprising the steps of:
(i) attaching the photosensitive dry film defined above at its photosensitive resin coating to a substrate to dispose the photosensitive resin coating thereon,
(ii) exposing a predetermined region of the photosensitive resin coating to radiation through a photomask and post-exposure baking, and
(iii) developing the photosensitive resin coating as post-exposure baked in a developer to dissolve away the unexposed region of the resin coating and to form a pattern of the resin coating.

The pattern forming process may further comprise (iv) post-curing the patterned resin coating resulting from development step (iii) at a temperature of 100 to 250° C.

In a preferred embodiment, the substrate has grooves and/or holes having an opening width of 10 to 100 µm and a depth of 10 to 120 µm.

In a typical application, the photosensitive resin composition is to form a coating for protecting electric and electronic parts or to form a coating for bonding two substrates together.

ADVANTAGEOUS EFFECTS OF INVENTION

The photosensitive resin composition and the photosensitive dry film comprising the silicone structure-containing polymer of the invention have many advantages of photosensitive material and can be readily processed in thick film form to define a fine size pattern. The resin coating obtained from the photosensitive resin composition or photosensitive dry film has improved film properties including adhesion to substrates, electronic parts, semiconductor devices, and supports for circuit boards, mechanical properties, and electric insulation, and is thus fully reliable as an insulating protective film. The resin coating also has crack resistance and is thus useful as a protective film-forming material for electric and electronic parts (such as circuit boards, semiconductor devices and display units) and a film-forming material for bonding substrates. The laminate obtained using the photosensitive resin composition or the photosensitive dry film has improved flatness.

DESCRIPTION OF PREFERRED EMBODIMENT

As used herein, the notation (Cn-Cm) means a group containing from n to m carbon atoms per group.

Silicone Structure-Containing Polymer

One embodiment of the invention is a silicone structure-containing polymer comprising recurring units having the formula (a1) and recurring units having the formula (b1).

For simplicity sake, this polymer is referred to as polymer A, and the recurring units are referred to as recurring units (a1) and (b1), respectively.

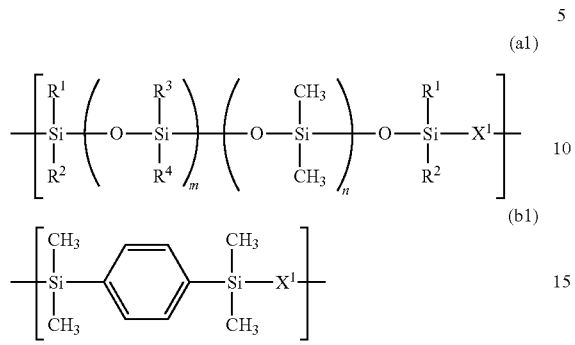

In formula (a1), $R^1$ to $R^4$ are each independently a $C_1$-$C_8$ monovalent hydrocarbon group, preferably $C_1$-$C_6$ hydrocarbon group. Suitable monovalent hydrocarbon groups include straight, branched or cyclic alkyl and aryl groups, for example, methyl, ethyl, propyl, hexyl, cyclohexyl, and phenyl. Inter alia, methyl and phenyl are preferred for availability of reactants.

In formula (a1), m and n are each independently an integer of 0 to 300, preferably 0 to 200, more preferably 0 to 100.

In formulae (a1) and (b1), $X^1$ is a divalent group having the formula (1).

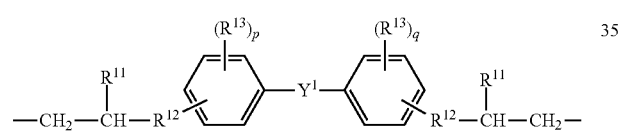

In formula (1), $R^{11}$ is each independently hydrogen or a $C_1$-$C_8$ monovalent hydrocarbon group in which at least one (one or more or even all) hydrogen may be substituted by halogen. Suitable monovalent hydrocarbon groups include those exemplified above for $R^1$ to $R^4$, and substituted forms of the foregoing in which one or more or even all hydrogen atoms are substituted by halogen atoms (e.g., chloro, bromo, fluoro or iodo).

In formula (1), $R^{12}$ is each independently a $C_1$-$C_8$ straight, branched or cyclic alkylene group in which any methylene moiety may be substituted by an ether bond or phenylene moiety.

In formula (1), $R^{13}$ is each independently hydrogen, a $C_1$-$C_8$ monovalent hydrocarbon group, hydroxyl group or glycidyl group, p and q are each independently an integer of 0 to 4.

In formula (1), $Y^1$ is a single bond or a divalent organic group having the formula (1-1), (1-2) or (1-3).

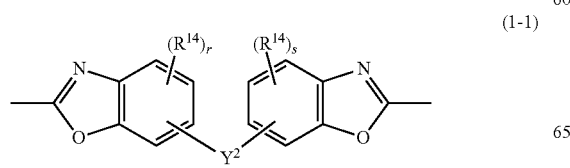

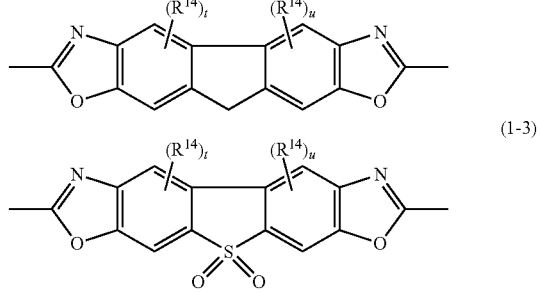

Herein $R^{14}$ is a $C_1$-$C_8$ monovalent hydrocarbon group in which at least one (one or more or even all) hydrogen may be substituted by halogen. Suitable monovalent hydrocarbon groups include those exemplified above for $R^1$ to $R^4$, and substituted forms of the foregoing in which one or more or even all hydrogen atoms are substituted by halogen atoms (e.g., chloro, bromo, fluoro or iodo). The subscripts r and s are each independently an integer of 0 to 3, t and u are each independently an integer of 0 to 2.

In formula (1-1), $Y^2$ is a divalent organic group, which is preferably selected from the following.

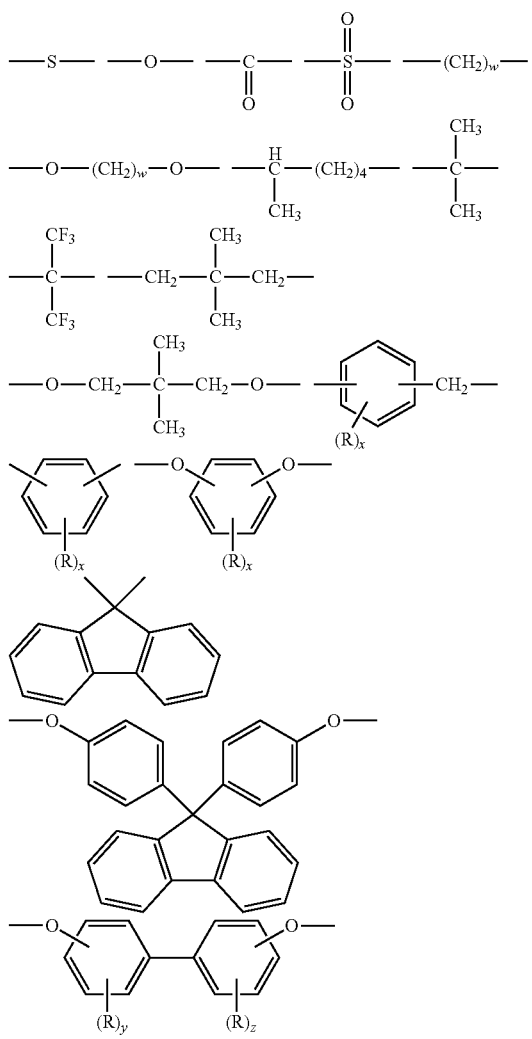

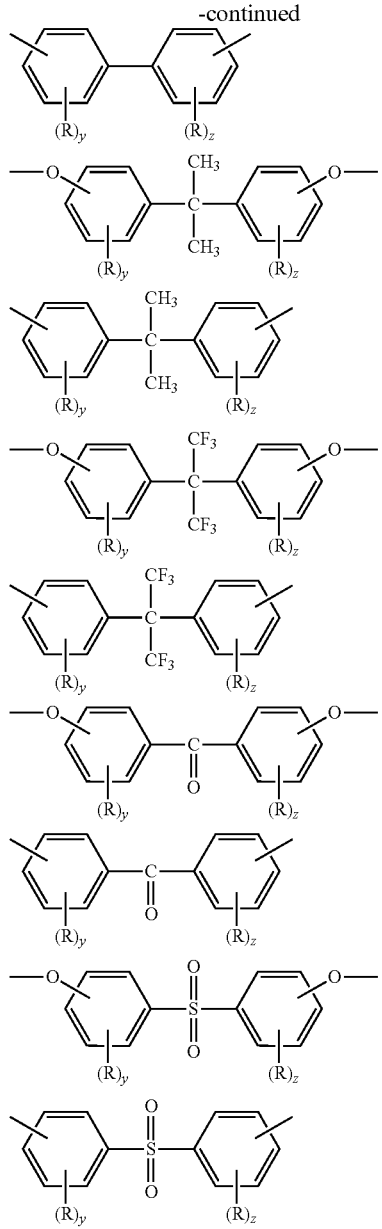

Herein R is each independently halogen, or a $C_1$-$C_8$ straight, branched or cyclic alkyl or haloalkyl group, w is an integer of 1 to 6, x is an integer of 0 to 4, preferably 0 to 2, and y and z are each independently an integer of 0 to 4, preferably 0 to 2.

More preferably, $Y^2$ is a group selected from the following.

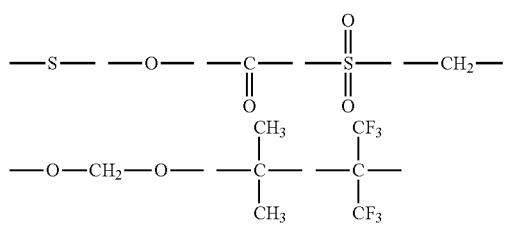

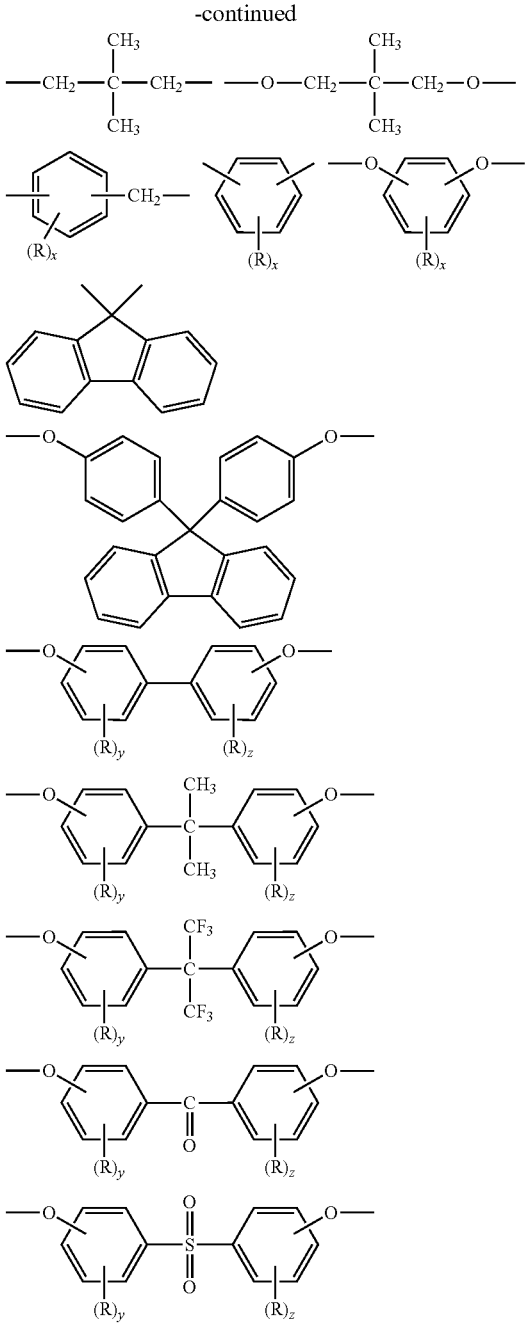

Herein R, x, y and z are as defined above.

The silicone structure-containing polymer A may further comprise recurring units having the formula (a2) and recurring units having the formula (b2). These recurring units are also referred to as recurring units (a2) and (b2), respectively.

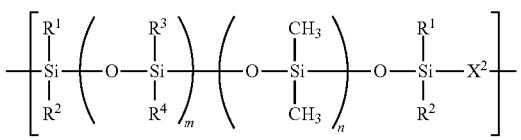

(a2)

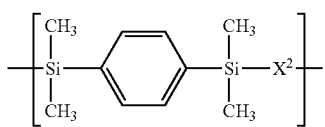
(b2)

In formulae (a2) and (b2), $R^1$ to $R^4$, m and n are as defined above. $X^2$ is a divalent group having the formula (2).

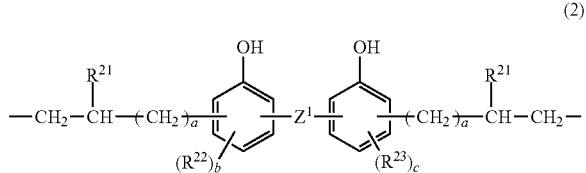
(2)

In formula (2), $Z^1$ is a single bond or a divalent organic group selected from the following.

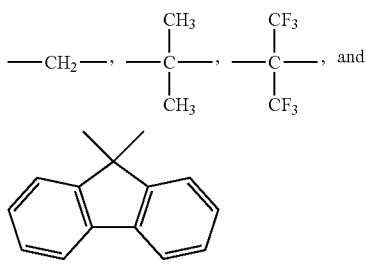

$R^{21}$ is each independently hydrogen or methyl. $R^{22}$ and $R^{23}$ are each independently a $C_1$-$C_4$ straight, branched or cyclic alkyl group or a $C_1$-$C_4$ straight, branched or cyclic alkoxy group, a is each independently an integer of 0 to 7, b and c are each independently an integer of 0 to 2.

The silicone structure-containing polymer A may further comprise recurring units having the formula (a3) and recurring units having the formula (b3). These recurring units are also referred to as recurring units (a3) and (b3), respectively.

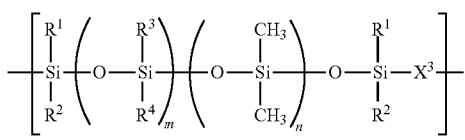
(a3)

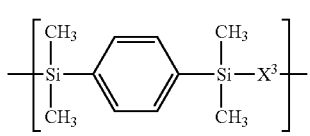
(b3)

In formulae (a3) and (b3), $R^1$ to $R^4$, m and n are as defined above. $X^3$ is a divalent group having the formula (3).

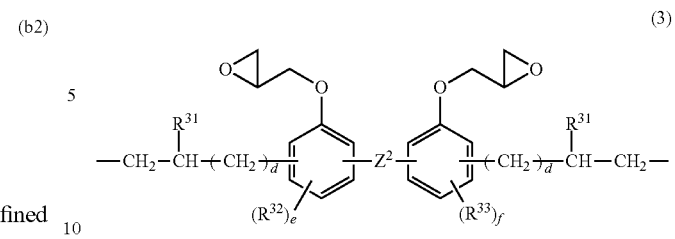
(3)

In formula (3), $Z^2$ is a single bond or a divalent organic group selected from the following.

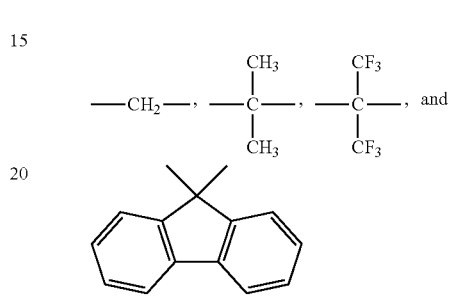

$R^{31}$ is each independently hydrogen or methyl. $R^{32}$ and $R^{33}$ are each independently a $C_1$-$C_4$ straight, branched or cyclic alkyl group or a $C_1$-$C_4$ straight, branched or cyclic alkoxy group, d is each independently an integer of 0 to 7, e and f are each independently an integer of 0 to 2.

The silicone structure-containing polymer A may further comprise recurring units having the formula (a4) and recurring units having the formula (b4). These recurring units are also referred to as recurring units (a4) and (b4), respectively.

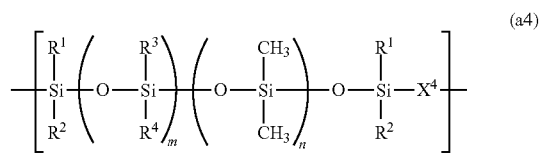
(a4)

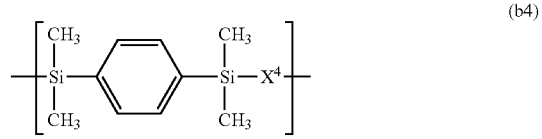
(b4)

In formulae (a4) and (b4), $R^1$ to $R^4$, m and n are as defined above. $X^4$ is a divalent group having the formula (4).

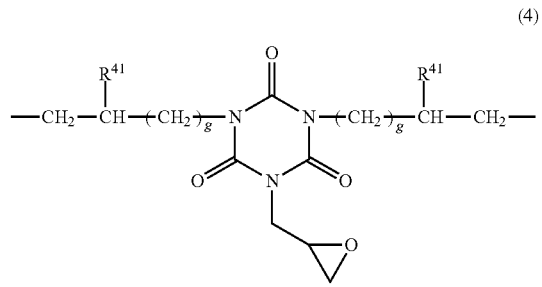
(4)

In formula (4), $R^{41}$ is each independently hydrogen or methyl, and g is each independently an integer of 0 to 7.

The silicone structure-containing polymer A may further comprise recurring units having the formula (a5) and recurring units having the formula (b5). These recurring units are also referred to as recurring units (a5) and (b5), respectively.

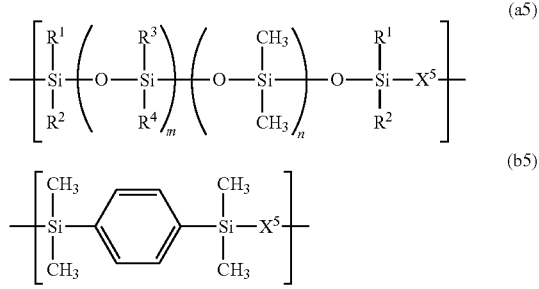

In formulae (a5) and (b5), $R^1$ to $R^4$, m and n are as defined above. $X^5$ is a divalent group having the formula (5).

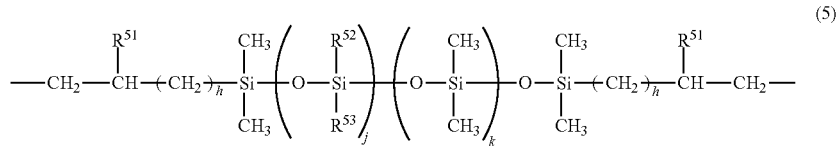

In formula (5), $R^{51}$ is each independently hydrogen or methyl. $R^{52}$ and $R^{53}$ are each independently a $C_1$-$C_8$ monovalent hydrocarbon group. Suitable monovalent hydrocarbon groups are as exemplified above for $R^1$ to $R^4$. The subscripts j and k are each independently an integer of 0 to 300, preferably 0 to 200, more preferably 0 to 100, and h is each independently an integer of 0 to 7.

The silicone structure-containing polymer A exerts a sufficient film-forming function. A resin coating obtained from the polymer has improved adhesion to substrates and analogues, a pattern forming ability, crack resistance, and heat resistance. Notably, the silicone structure-containing polymer A has crosslinking groups such as epoxy and hydroxyl groups or crosslinking reaction-susceptible reactive sites in the molecule.

The aforementioned recurring units may be arranged either randomly or blockwise. In the silicone structure-containing polymer A, the content of silicone (i.e., siloxane units) is preferably 30 to 80% by weight.

In the silicone structure-containing polymer A, appropriate fractions of recurring units (a1), (a2), (a3), (a4), (a5), (b1), (b2), (b3), (b4) and (b5) are $0<a1<1.0$, $0\leq a2<1.0$, $0\leq a3<1.0$, $0\leq a4<1.0$, $0\leq a5<1.0$, $0<b1<1.0$, $0\leq b2<1.0$, $0\leq b3<1.0$, $0\leq b4<1.0$, $0\leq b5<1.0$, and $0<a1+b1\leq 1.0$; more preferably $0<a2+b2+a3+b3+a4+b4$ 0.95; even more preferably $0.1\leq a1+b1\leq 0.6$, $0<a2+b2\leq 0.7$, $0<a3+b3\leq 0.9$, $0<a4+b4\leq 0.4$, $0\leq a5+b5\leq 0.4$, $0<a2+b2+a3+b3+a4+b4\leq 0.9$, $0.1\leq a1+a2+a3+a4+a5\leq 0.7$, and $0.3\leq b1+b2+b3+b4+b5\leq 0.9$. Notably, $a1+a2+a3+a4+a5+b1+b2+b3+b4+b5=1$.

The silicone structure-containing polymer A preferably has a weight average molecular weight (Mw) of 3,000 to 500,000, more preferably 5,000 to 200,000. It is noted throughout the disclosure that Mw is measured by gel permeation chromatography (GPC) versus polystyrene standards using tetrahydrofuran as the elute.

Method of Preparing Silicone Structure-Containing Polymer

The silicone structure-containing polymer A may be prepared by addition polymerization of a compound having the formula (6), a compound having the formula (7), a compound having the formula (8), and optionally at least one compound selected from compounds having the formulae (9), (10) and (11), and a compound having the formula (12), all shown below, in the presence of a metal catalyst.

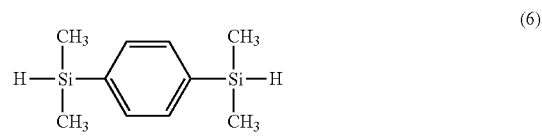

-continued

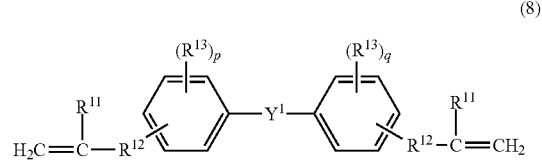

Herein $R^1$ to $R^4$, m and n are as defined above.

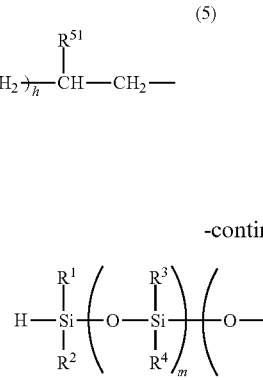

Herein $R^{11}$ to $R^{13}$, $Y^1$, p and q are as defined above.

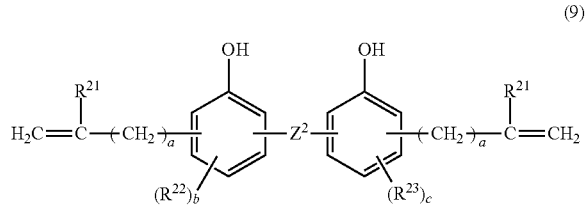

-continued

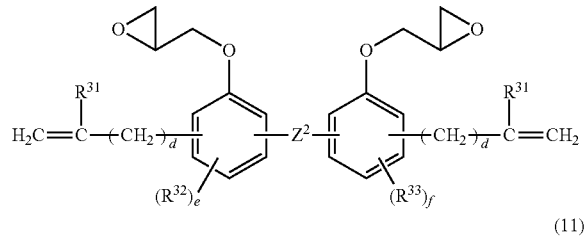
(10)

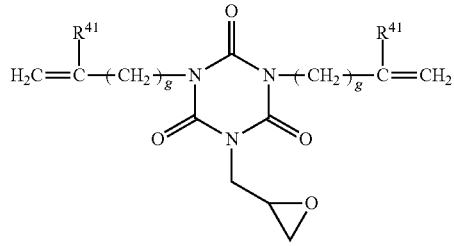
(11)

Herein $R^{21}$ to $R^{23}$, $R^{31}$ to $R^{33}$, $R^{41}$, $Z^1$, $Z^2$, a, b, c, d, e, f, and g are as defined above.

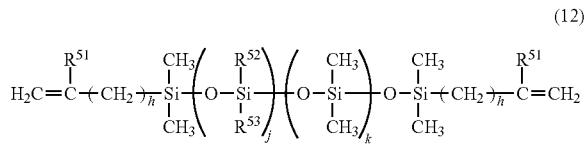
(12)

Herein $R^{51}$ to $R^{53}$, h, j and k are as defined above.

Examples of the metal catalyst used include platinum group metals alone such as platinum (including platinum black), rhodium and palladium; platinum chlorides, chloroplatinic acids and chloroplatinates such as $H_2PtCl_4 \cdot xH_2O$, $H_2PtCl_6 \cdot xH_2O$, $NaHPtCl_6 \cdot xH_2O$, $KHPtCl_6 \cdot xH_2O$, $Na_2PtCl_6 \cdot xH_2O$, $K_2PtCl_4 \cdot xH_2O$, $PtCl_4 \cdot xH_2O$, $PtCl_2$ and $Na_2HPtCl_4 \cdot xH_2O$, wherein x is preferably an integer of 0 to 6, more preferably 0 or 6; alcohol-modified chloroplatinic acids as described in U.S. Pat. No. 3,220,972; chloroplatinic acid-olefin complexes as described in U.S. Pat. No. 3,159,601, U.S. Pat. No. 3,159,662 and U.S. Pat. No. 3,775,452; supported catalysts comprising platinum group metals such as platinum black and palladium on supports of alumina, silica and carbon; rhodium-olefin complexes; chlorotris(triphenylphosphine)rhodium (known as Wilkinson's catalyst); and complexes of platinum chlorides, chloroplatinic acids and chloroplatinates with vinyl-containing siloxanes, specifically vinyl-containing cyclosiloxanes.

The catalyst is used in a catalytic amount, which is preferably 0.001 to 0.1% by weight, more preferably 0.01 to 0.1% by weight of platinum group metal based on the total weight of the compounds (exclusive of the solvent) used in the addition polymerization.

In the addition polymerization, a solvent may be used, if desired. Suitable solvents are hydrocarbon solvents such as toluene and xylene. The reaction temperature is preferably in a range of 40 to 150° C., more preferably 60 to 120° C., within which the catalyst is not deactivated and the polymerization can be completed within a short time. The polymerization time varies with the type and amount of the resulting resin. It is preferably about 0.5 to about 100 hours, more preferably about 0.5 to about 30 hours for preventing moisture entry into the polymerization system. After the completion of reaction, the solvent (if used) is distilled off, whereupon the silicone structure-containing polymer A is obtained.

The reaction procedure is not particularly limited. For example, when a compound having formula (6), a compound having formula (7), a compound having formula (8), a compound having formula (9), a compound having formula (10), a compound having formula (11), and a compound having formula (12) are reacted, the preferred procedure is by first mixing the compounds having formulae (8), (9), (10), (11) and (12), heating, adding a metal catalyst to the mixture, and then adding the compounds having formulae (6) and (7) dropwise over 0.1 to 5 hours.

In the addition polymerization, the reactants are preferably combined in such amounts that a molar ratio of the total amount of hydrosilyl groups in the compounds having formulae (6) and (7) to the total amount of alkenyl groups in the compounds having formulae (8), (9), (10), (11) and (12) may range from 0.67 to 1.67, more preferably from 0.83 to 1.25.

More particularly, the compounds having formulae (6) and (7) are preferably combined in such amounts that a molar ratio of (6):(7) may range from 5:95 to 20:80, more preferably from 10:90 to 70:30.

Also, provided that N8, N9, N10, N11 and N12 represent amounts (mol) of compounds having formulae (8), (9), (10), (11) and (12), respectively, and X=N8+N9+N10+N11+N12, the amounts are preferably in the range: 0<N8/X≤1.0, 0≤N9/X<1.0, 0≤N10/X<1.0, 0≤N11/X<1.0, and 0≤N12/X<1.0; more preferably 0.1≤N8/X≤0.6, 0<N9/X≤0.7, 0≤N10/X≤0.9, 0<N11/X≤0.4, 0 (N9+N10+N11)/X≤0.9, and 0≤N12/X≤0.4.

The Mw of the resulting polymer can be controlled using a molecular weight control agent such as a monoallyl compound (e.g., o-allylphenol), monohydrosilane (e.g., triethylhydrosilane) or monohydrosiloxane.

The compounds having formulae (6) through (12) are available as commercial products or may be synthesized by conventional well-known methods.

Photosensitive Resin Composition

Another embodiment of the invention is a photosensitive resin composition comprising (A) a base resin containing the silicone structure-containing polymer A defined above and (B) a photoacid generator which is decomposed to generate an acid upon exposure to light with a wavelength of 190 to 500 nm. From the photosensitive resin composition, a film having a thickness varying over a wide range can be formed, from which a pattern having a fine size and perpendicularity can be formed by a pattern forming process to be described later. A cured film obtained from the photosensitive resin composition or a dry film comprising the same by a pattern forming process to be described later is improved in patterning accuracy, heat resistance, electric insulation, reliability as dielectric protective film, and adhesion to substrates and analogues.

(A) Base Resin

In addition to the silicone structure-containing polymer A defined above, the base resin as component (A) may contain another silicone structure-containing polymer. Exemplary of the other silicone structure-containing polymer are a silicone structure-containing polymer comprising recurring units (a2) and recurring units (b2), referred to as silicone structure-containing polymer B, hereinafter, a silicone structure-containing polymer comprising recurring units (a3) and recurring units (b3), referred to as silicone structure-containing polymer C, hereinafter, a silicone structure-containing polymer comprising recurring units (a4) and recurring units (b4), referred to as silicone structure-containing polymer D, hereinafter, and a silicone structure-containing polymer comprising recurring units (a5) and recurring units (b5), referred to as silicone structure-containing polymer E, hereinafter.

When the base resin as component (A) contains any of silicone structure-containing polymers B to E, the silicone structure-containing polymer A should preferably consist of recurring units (a1) and (b1). In this case, fractions of recurring units (a1) and (b1) are $0<a1<1.0$, $0<b1<1.0$, and $a1+b1=1.0$, preferably $0.1 \leq a1<0.7$, $0.3 \leq b1 \leq 0.9$, and $a1+b1=1.0$.

In the silicone structure-containing polymer B, fractions of recurring units (a2) and (b2) are $0<a2<1.0$, $0<b2<1.0$, and $a2+b2=1.0$, preferably $0.1 \leq a2<0.7$, $0.3 \leq b2 \leq 0.9$, and $a2+b2=1.0$. In the silicone structure-containing polymer C, fractions of recurring units (a3) and (b3) are $0<a3<1.0$, $0<b3<1.0$, and $a3+b3=1.0$, preferably $0.1 \leq a3<0.7$, $0.3 \leq b3 \leq 0.9$, and $a3+b3=1.0$. In the silicone structure-containing polymer D, fractions of recurring units (a4) and (b4) are $0<a4<1.0$, $0<b4<1.0$, and $a4+b4=1.0$, preferably $0.1 \leq a4<0.7$, $0.3 \leq b4 \leq 0.9$, and $a4+b4=1.0$. In the silicone structure-containing polymer E, fractions of recurring units (a5) and (b5) are $0<a5<1.0$, $0<b5<1.0$, and $a5+b5=1.0$, preferably $0.1 \leq a5<0.7$, $0.3 \leq b5 \leq 0.9$, and $a5+b5=1.0$.

Where the base resin as component (A) contains one or more of silicone structure-containing polymers B to E, the content of each polymer is preferably from more than 0 part to 100 parts by weight per 100 parts by weight of the silicone structure-containing polymer A.

(B) Photoacid Generator

The photosensitive resin composition of the invention also comprises a photoacid generator (PAG) as component (B). The PAG is typically a compound which is decomposed to generate an acid upon exposure to light with a wavelength of 190 to 500 nm, the generated acid serving as a curing catalyst. Since the photosensitive resin composition of the invention is highly compatible with the PAG, the PAG may be selected from a wide variety of such compounds. Typical PAGs include onium salts, diazomethane derivatives, glyoxime derivatives, β-ketosulfone derivatives, disulfone derivatives, nitrobenzyl sulfonate derivatives, sulfonic acid ester derivatives, imido-yl sulfonate derivatives, oxime sulfonate derivatives, and imino sulfonate derivatives.

Suitable onium salts include sulfonium salts having the following formula (13) and iodonium salts having the following formula (14).

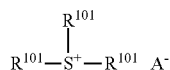

(13)

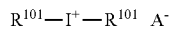

(14)

In formulae (13) and (14), $R^{101}$ is each independently a straight, branched or cyclic $C_1$-$C_{12}$ alkyl group, $C_6$-$C_{12}$ aryl group, or $C_7$-$C_{12}$ aralkyl group, which may have a substituent. $A^-$ is a non-nucleophilic counter-ion.

Examples of alkyl groups include methyl, ethyl, propyl, butyl, cyclohexyl, norbornyl, and adamantyl. Exemplary aryl groups include phenyl, naphthyl and biphenylyl. Exemplary aralkyl groups include benzyl and phenethyl. Examples of the substituent include oxo, straight, branched or cyclic $C_1$-$C_{12}$ alkoxy groups, straight, branched or cyclic $C_1$-$C_{12}$ alkyl groups, $C_6$-$C_{24}$ aryl groups, $C_7$-$C_{25}$ aralkyl groups, $C_6$-$C_{24}$ aryloxy groups, and $C_6$-$C_{24}$ arylthio groups.

Preferably $R^{101}$ is selected from optionally substituted alkyl groups such as methyl, ethyl, propyl, butyl, cyclohexyl, norbornyl, adamantyl, 2-oxocyclohexyl; optionally substituted aryl groups such as phenyl, naphthyl, biphenylyl, o-, m- or p-methoxyphenyl, ethoxyphenyl, m- or p-tert-butoxyphenyl, 2-, 3- or 4-methylphenyl, ethylphenyl, 4-tert-butylphenyl, 4-butylphenyl, dimethylphenyl, terphenylyl, biphenylyloxyphenyl, and biphenylylthiophenyl; and optionally substituted aralkyl groups such as benzyl and phenethyl. Inter alia, optionally substituted aryl groups and optionally substituted aralkyl groups are more preferred.

Examples of the non-nucleophilic counter-ion represented by $A^-$ include halide ions such as chloride and bromide; fluoroalkanesulfonate ions such as triflate, 1,1,1-trifluoroethanesulfonate, and nonafluorobutanesulfonate; arylsulfonate ions such as tosylate, benzenesulfonate, 4-fluorobenzenesulfonate, and 1,2,3,4,5-pentafluorobenzenesulfonate; alkylsulfonate ions such as mesylate and butanesulfonate; fluoroalkanesulfonimide ions such as trifluoromethanesulfonimide; and fluoroalkanesulfonylmethide ions such as tris(trifluoromethanesulfonyl)methide.

Exemplary diazomethane derivatives are compounds of the following formula (15).

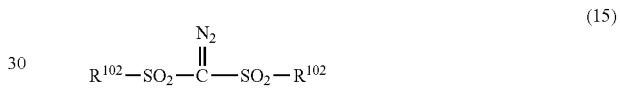

(15)

In formula (15), $R^{102}$ is each independently a straight, branched or cyclic $C_1$-$C_{12}$ alkyl or haloalkyl group, optionally substituted $C_6$-$C_{12}$ aryl group, or $C_7$-$C_{12}$ aralkyl group.

Examples of the alkyl group include methyl, ethyl, n-propyl, isopropyl, cyclopropyl, n-butyl, isobutyl, sec-butyl, tert-butyl, cyclobutyl, n-pentyl, cyclopentyl, cyclohexyl, norbornyl, and adamantyl. Exemplary haloalkyl groups include trifluoromethyl, 1,1,1-trifluoroethyl, 1,1,1-trichloroethyl, and nonafluorobutyl.

Examples of the optionally substituted aryl groups include phenyl; alkoxyphenyl groups such as o-, m- or p-methoxyphenyl, ethoxyphenyl, m- or p-tert-butoxyphenyl; alkylphenyl groups such as 2-, 3- or 4-methylphenyl, ethylphenyl, 4-tert-butylphenyl, 4-butylphenyl, and dimethylphenyl; and haloaryl groups such as fluorophenyl, chlorophenyl, and 1,2,3,4,5-pentafluorophenyl. Exemplary aralkyl groups include benzyl and phenethyl.

Exemplary onium salts include diphenyliodonium trifluoromethanesulfonate, (p-tert-butoxyphenyl)phenyliodonium trifluoromethanesulfonate, diphenyliodonium p-toluenesulfonate, (p-tert-butoxyphenyl)phenyliodonium p-toluenesulfonate, triphenylsulfonium trifluoromethanesulfonate, (p-tert-butoxyphenyl)diphenylsulfonium trifluoromethanesulfonate, bis(p-tert-butoxyphenyl)phenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, bis(p-tert-butoxyphenyl)phenylsulfonium p-toluenesulfonate, tris(p-tert-butoxyphenyl)sulfonium p-toluenesulfonate, triphenylsulfonium nonafluorobutanesulfonate, triphenylsulfonium butanesulfonate, trimethylsulfonium trifluoromethanesulfonate, trimethylsulfonium p-toluenesulfonate, cyclohexylmethyl(2-oxocyclohexyl)sulfonium trifluoromethanesulfonate, cyclohexylmethyl(2-oxocyclohexyl)sulfonium p-toluenesulfonate, dimethylphenylsulfonium trifluoromethanesulfonate, dimethylphenylsulfonium p-toluenesulfonate, dicyclohexylphenylsulfonium trifluoromethanesulfonate, dicyclohexylphenylsulfonium p-toluenesulfonate, bis(4-tert-butylphenyl)iodonium hexafluorophosphate, diphenyl (4-thiophenoxyphenyl)sulfonium hexafluoroantimonate, [4-(4-biphenylylthio)phenyl]-4-biphenylylphenylsulfonium tris(trifluoromethanesulfonyl)methide.

Exemplary diazomethane derivatives include bis(benzenesulfonyl)diazomethane, bis(p-toluenesulfonyl)diazomethane, bis(xylenesulfonyl)diazomethane, bis(cyclohexylsulfonyl)diazomethane, bis(cyclopentylsulfonyl)diazomethane, bis(n-butylsulfonyl)diazomethane, bis(isobutylsulfonyl)diazomethane, bis(sec-butylsulfonyl)diazomethane, bis(n-propylsulfonyl)diazomethane, bis(isopropylsulfonyl)diazomethane, bis(tert-butylsulfonyl)diazomethane, bis(n-pentylsulfonyl)diazomethane, bis(isopentylsulfonyl)diazomethane, bis(sec-pentylsulfonyl)diazomethane, bis(tert-pentylsulfonyl)diazomethane, 1-cyclohexylsulfonyl-1-(tert-butylsulfonyl)diazomethane, 1-cyclohexylsulfonyl-1-(tert-pentylsulfonyl)diazomethane, and 1-tert-pentylsulfonyl-1-(tert-butylsulfonyl)diazomethane.

Exemplary glyoxime derivatives include bis-O-(p-toluenesulfonyl)-α-dimethylglyoxime, bis-O-(p-toluenesulfonyl)-α-diphenylglyoxime, bis-O-(p-toluenesulfonyl)-α-dicyclohexylglyoxime, bis-O-(p-toluenesulfonyl)-2,3-pentanedioneglyoxime, bis-O-(p-toluenesulfonyl)-2-methyl-3,4-pentanedioneglyoxime, bis-O-(n-butanesulfonyl)-α-dimethylglyoxime, bis-O-(n-butanesulfonyl)-α-diphenylglyoxime, bis-O-(n-butanesulfonyl)-α-dicyclohexylglyoxime, bis-O-(n-butanesulfonyl)-2,3-pentanedioneglyoxime, bis-O-(n-butanesulfonyl)-2-methyl-3,4-pentanedioneglyoxime, bis-O-(methanesulfonyl)-α-dimethylglyoxime, bis-O-(trifluoromethanesulfonyl)-α-dimethylglyoxime, bis-O-(1,1,1-trifluoroethanesulfonyl)-α-dimethylglyoxime, bis-O-(tert-butanesulfonyl)-α-dimethylglyoxime, bis-O-(perfluorooctanesulfonyl)-α-dimethylglyoxime, bis-O-(cyclohexanesulfonyl)-α-dimethylglyoxime, bis-O-(benzenesulfonyl)-α-dimethylglyoxime, bis-O-(p-fluorobenzenesulfonyl)-α-dimethylglyoxime, bis-O-(p-tert-butylbenzenesulfonyl)-α-dimethylglyoxime, bis-O-(xylenesulfonyl)-α-dimethylglyoxime, and bis-O-(camphorsulfonyl)-α-dimethylglyoxime.

Exemplary β-ketosulfone derivatives include 2-cyclohexylcarbonyl-2-(p-toluenesulfonyl)propane and 2-isopropylcarbonyl-2-(p-toluenesulfonyl)propane.

Exemplary disulfone derivatives include diphenyl disulfone and dicyclohexyl disulfone.

Exemplary nitrobenzyl sulfonate derivatives include 2,6-dinitrobenzyl p-toluenesulfonate and 2,4-dinitrobenzyl p-toluenesulfonate.

Exemplary sulfonic acid ester derivatives include 1,2,3-tris(methanesulfonyloxy)benzene, 1,2,3-tris(trifluoromethanesulfonyloxy)benzene, and 1,2,3-tris(p-toluenesulfonyloxy)benzene.

Exemplary imido-yl sulfonate derivatives include phthalimidoyl triflate, phthalimidoyl tosylate, 5-norbornene-2,3-dicarboxyimidoyl triflate, 5-norbornene-2,3-dicarboxyimidoyl tosylate, 5-norbornene-2,3-dicarboxyimidoyl n-butylsulfonate, and N-trifluoromethylsulfonyloxynaphthylimide.

Typical of the oxime sulfonate derivative is α-(benzenesulfoniumoxyimino)-4-methylphenylacetonitrile.

Also included are iminosulfonate derivatives such as (5-(4-methylphenyl)sulfonyloxyimino-5H-thiophen-2-ylidene)-(2-methylphenyl)acetonitrile and (5-(4-(4-methylphenylsulfonyloxy)phenylsulfonyloxyimino)-5H-thiophen-2-ylidene)-(2-methylphenyl)acetonitrile, as well as 2-methyl-2[(4-methylphenyl)sulfonyl]-1-[(4-methylthio)phenyl]-1-propane.

As the PAG, the above-exemplified onium salts are preferred, and the above-exemplified sulfonium salts are more preferred.

From the standpoint of photo-cure, the PAG (B) is preferably used in an amount of 0.05 to 20 parts by weight, and more preferably 0.05 to 5 parts by weight per 100 parts by weight of component (A). When the amount of the PAG is at least 0.05 part, it may generate a sufficient amount of acid for crosslinking reaction to proceed. As long as the amount of the PAG is up to 20 parts, any increase of the light absorption by the PAG itself is prevented and a lowering of transparency is avoided. The PAGs may be used alone or in admixture of two or more.

(C) Crosslinker

The photosensitive resin composition may further comprise (C) a crosslinker. The crosslinker undergoes condensation reaction with $R^{13}$ in formula (1) in component (A) to facilitate pattern formation and to increase the strength of a resin coating after photo-cure.

The preferred crosslinker is a resin having a weight average molecular weight (Mw) of 150 to 10,000, more preferably 200 to 3,000. A Mw of at least 150 ensures sufficient photo-cure whereas a Mw of up to 10,000 eliminates the risk of exacerbating the heat resistance of the composition after photo-cure. Suitable resins include phenolic resins, epoxy resins and alkoxy-containing resins.

Preferably, the crosslinker is selected from amino condensates modified with formaldehyde or formaldehyde-alcohol, phenol compounds having on the average at least two methylol or alkoxymethylol groups in the molecule, and epoxy compounds having on the average at least two epoxy groups in the molecule. These compounds may be used alone or in admixture.

Examples of the amino condensate modified with formaldehyde or formaldehyde-alcohol include melamine condensates modified with formaldehyde or formaldehyde-alcohol, and urea condensates modified with formaldehyde or formaldehyde-alcohol.

The modified melamine condensates are obtained, for example, by effecting addition polycondensation of a modified melamine having the formula (16) or an oligomer (e.g., dimer or trimer) thereof with formaldehyde until a desired molecular weight is reached.

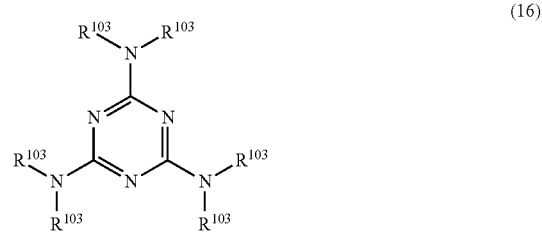

(16)

In formula (16), $R^{103}$ is each independently a methylol group, $C_2$-$C_5$ alkoxymethyl group or hydrogen, and at least one $R^{103}$ is a methylol or alkoxymethyl group. Exemplary alkoxymethyl groups include methoxymethyl and ethoxymethyl.

Illustrative, non-limiting, examples of the modified melamine having formula (16) include trimethoxymethylmonomethylolmelamine, dimethoxymethylmonomethylolmelamine, trimethylolmelamine, hexamethylolmelamine, and hexamethoxymethylolmelamine.

The modified melamine having formula (16) is prepared, for example, by modifying a melamine monomer with formaldehyde into a methylol form in a well-known manner, and optionally, further modifying it with an alcohol into an alkoxy form. The alcohols used herein are lower alcohols, for example, alcohols of 1 to 4 carbon atoms.

The addition polycondensation may be performed by any well-known methods. The modified melamine having formula (16) may be used alone or in admixture.

Examples of the urea condensate modified with formaldehyde or formaldehyde-alcohol include methoxymethylated urea condensates, ethoxymethylated urea condensates, and propoxymethylated urea condensates.

The modified urea condensates are prepared, for example, by modifying a urea condensate having a desired molecular weight with formaldehyde into a methylol form in a well-known manner, and optionally, further modifying it with an alcohol into an alkoxy form.

Examples of the phenol compound having on the average at least two methylol or alkoxymethylol groups in a molecule include (2-hydroxy-5-methyl)-1,3-benzenedimethanol and 2,2', 6,6'-tetramethoxymethylbisphenol A.

Examples of the epoxy compound having at least two epoxy groups include bisphenol epoxy resins such as bisphenol A epoxy resins and bisphenol F epoxy resins, novolak epoxy resins such as phenol novolak epoxy resins and cresol novolak epoxy resins, triphenol alkane epoxy resins, biphenyl epoxy resins, dicyclopentadiene-modified phenol novolak epoxy resins, phenol aralkyl epoxy resins, biphenyl aralkyl epoxy resins, naphthalene ring-containing epoxy resins, glycidyl ester epoxy resins, cycloaliphatic epoxy resins, and heterocyclic epoxy resins.

The crosslinker (C) may be used in an amount of 0 to 100 parts, preferably 0.5 to 100 parts, more preferably 0.5 to 50 parts, and even more preferably 1 to 30 parts by weight per 100 parts by weight of component (A). At least 0.5 part of component (C) ensures sufficient cure upon light exposure. As long as the amount of component (C) is up to 100 parts, the proportion of component (A) in the resin composition is not reduced, allowing the cured composition to exert its effects to the full extent. Component (C) may be used alone or in admixture.

(D) Solvent

The photosensitive resin composition may further comprise a solvent as component (D). The solvent used herein is not particularly limited as long as the foregoing components, and component (E) and additives to be described later are soluble. When a solvent is used, the resin composition is improved in coating properties.

Preferred are organic solvents in which the foregoing components are fully soluble. Illustrative, non-limiting, examples of the organic solvent include ketones such as cyclohexanone, cyclopentanone and methyl-2-n-pentylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate, and γ-butyrolactone. These solvents may be used alone or in admixture. Of these solvents, preferred are ethyl lactate, cyclohexanone, cyclopentanone, PGMEA, γ-butyrolactone, and mixtures thereof, in which the PAG is most soluble. The solvent (D) may be used in an amount of 0 to 5,000 parts by weight per 100 parts by weight of components (A) and (B) combined. From the standpoints of compatibility and viscosity of the resin composition, the amount of the solvent (D) used is preferably 50 to 2,000 parts, more preferably 50 to 1,000 parts, and even more preferably 50 to 100 parts by weight.

(E) Basic Compound

The photosensitive resin composition may further contain a basic compound as component (E). The basic compound used herein is preferably a compound capable of suppressing the rate of diffusion when the acid generated by the PAG diffuses within the resin coating. The inclusion of the basic compound improves resolution, suppresses changes in sensitivity following exposure and reduces substrate and environment dependence, as well as improving the exposure latitude and the pattern profile.

Examples of the basic compound include primary, secondary, and tertiary aliphatic amines, mixed amines, aromatic amines, heterocyclic amines, nitrogen-containing compounds with carboxyl group, nitrogen-containing compounds with sulfonyl group, nitrogen-containing compounds with hydroxyl group, nitrogen-containing compounds with hydroxyphenyl group, alcoholic nitrogen-containing compounds, amide derivatives, and imide derivatives.

Suitable primary aliphatic amines include ammonia, methylamine, ethylamine, n-propylamine, isopropylamine, n-butylamine, isobutylamine, sec-butylamine, tert-butylamine, pentylamine, tert-pentylamine, cyclopentylamine, hexylamine, cyclohexylamine, heptylamine, octylamine, nonylamine, decylamine, dodecylamine, cetylamine, methylenediamine, ethylenediamine, and tetraethylenepentamine.

Suitable secondary aliphatic amines include dimethylamine, diethylamine, di-n-propylamine, diisopropylamine, di-n-butylamine, diisobutylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine.

Suitable tertiary aliphatic amines include trimethylamine, triethylamine, tri-n-propylamine, triisopropylamine, tri-n-butylamine, triisobutylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Suitable mixed amines include dimethylethylamine, methylethylpropylamine, benzylamine, phenethylamine, and benzyldimethylamine.

Examples of the aromatic and heterocyclic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl) amine, methyldiphenylamine, triphenylamine, phenylenediamine, naphthylamine, diaminonaphthalene, pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridine, 4-pyrrolidinopyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Suitable nitrogen-containing compounds with carboxyl group include aminobenzoic acid, indolecarboxylic acid, and amino acid derivatives (e.g. nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine).

Suitable nitrogen-containing compounds with sulfonyl group include 3-pyridinesulfonic acid and pyridinium p-toluenesulfonate.

Examples of suitable nitrogen-containing compounds with hydroxyl group, nitrogen-containing compounds with hydroxyphenyl group, and alcoholic nitrogen-containing compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidine ethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide.

Suitable amide derivatives include formamide, N-methylformamide, N,N-dimethylformamide, acetamide, N-methylacetamide, N,N-dimethylacetamide, propionamide, and benzamide.

Suitable imide derivatives include phthalimide, succinimide, and maleimide. Basic compounds having the formula (17) are also useful.

$$(R^{104})_v\text{-}N\text{-}(R^{105})_{3-v} \qquad (17)$$

In formula (17), v is 1, 2 or 3. $R^{104}$ is independently selected from substituent groups of the following formulae (18) to (20). $R^{105}$ is independently hydrogen or a straight, branched or cyclic $C_1$-$C_{20}$ alkyl group which may contain an ether bond or hydroxyl moiety. When at least two groups $R^{104}$ are included, two groups $R^{104}$ may bond together to form a ring with the nitrogen atom. Also when at least two groups $R^{104}$ are included, they may be identical or different. When at least two groups $R^{105}$ are included, they may be identical or different.

$$\text{---}R^{106}\text{---}O\text{---}R^{107} \qquad (18)$$

$$\text{---}R^{108}\text{---}O\text{---}R^{109}\text{---}\overset{O}{\underset{\|}{C}}\text{---}R^{110} \qquad (19)$$

$$\text{---}R^{111}\text{---}\overset{O}{\underset{\|}{C}}\text{---}O\text{---}R^{112} \qquad (20)$$

In formulae (18) to (20), $R^{106}$, $R^{108}$ and $R^{111}$ are each independently a straight or branched $C_1$-$C_4$ alkylene group. $R^{107}$ and $R^{110}$ are each independently hydrogen or a straight, branched or cyclic $C_1$-$C_{20}$ alkyl group which may contain at least one hydroxyl moiety, ether bond, ester bond and/or lactone ring. $R^{109}$ is a single bond or a straight or branched $C_1$-$C_4$ alkylene group. $R^{112}$ is a straight, branched or cyclic $C_1$-$C_{20}$ alkyl group which may contain at least one hydroxyl moiety, ether bond, ester bond and/or lactone ring.

Examples of the compound having formula (17) include, but are not limited to, tris[2-(methoxymethoxy)ethyl]amine, tris[2-(2-methoxyethoxy)ethyl]amine, tris[2-(2-methoxyethoxymethoxy)ethyl]amine, tris[2-(1-methoxyethoxy)ethyl]amine, tris[2-(1-ethoxyethoxy)ethyl]amine, tris[2-(1-ethoxypropoxy)ethyl]amine, tris [2-{2-(2-hydroxyethoxy)ethoxy} ethyl]amine, 4,7,13,16,21,24-hexaoxa-1,10-diazabicyclo[8.8.8]hexacosane, 4,7,13,18-tetraoxa-1,10-diazabicyclo[8.5.5]eicosane, 1,4,10,13-tetraoxa-7,16-diazabicyclooctadecane, 1-aza-12-crown-4, 1-aza-15-crown-5, 1-aza-18-crown-6, tris(2-formyloxyethyl)amine, tris(2-acetoxyethyl)amine, tris(2-propionyloxyethyl)amine, tris(2-butyryloxyethyl)amine, tris(2-isobutyryloxyethyl) amine, tris(2-valeryloxyethyl)amine, tris(2-pivaloyloxyethyl)amine, N,N-bis(2-acetoxyethyl)-2-(acetoxyacetoxy) ethylamine, tris(2-methoxycarbonyloxyethyl)amine, tris(2-tert-butoxycarbonyloxyethyl)amine, tris[2-(2-oxopropoxy) ethyl]amine, tris[2-(methoxycarbonylmethyl)oxyethyl] amine, tris [2-(tert-butoxycarbonylmethyloxy)ethyl]amine, tris [2-(cyclohexyloxycarbonylmethyloxy)ethyl]amine, tris (2-methoxycarbonylethyl)amine, tris(2-ethoxycarbonylethyl)amine, N,N-bis(2-hydroxyethyl)-2-(methoxycarbonyl)ethylamine, N,N-bis(2-acetoxyethyl)-2-(methoxycarbonyl)ethylamine, N,N-bis(2-hydroxyethyl)-2-(ethoxycarbonyl)ethylamine, N,N-bis(2-acetoxyethyl)-2-(ethoxycarbonyl)ethylamine, N,N-bis(2-hydroxyethyl)-2-(2-methoxyethoxycarbonyl)ethylamine, N,N-bis(2-acetoxyethyl)-2-(2-methoxyethoxycarbonyl)ethylamine, N,N-bis(2-hydroxyethyl)-2-(2-hydroxyethoxycarbonyl)ethylamine, N,N-bis(2-acetoxyethyl)-2-(2-acetoxyethoxycarbonyl)ethylamine, N,N-bis(2-hydroxyethyl)-2-[(methoxycarbonyl)methoxycarbonyl]ethylamine, N,N-bis(2-acetoxyethyl)-2-[(methoxycarbonyl)methoxycarbonyl]ethylamine, N,N-bis(2-hydroxyethyl)-2-(2-oxopropoxycarbonyl)ethylamine, N,N-bis(2-acetoxyethyl)-2-(2-oxopropoxycarbonyl)ethylamine, N,N-bis(2-hydroxyethyl)-2-(tetrahydrofurfuryloxycarbonyl)ethylamine, N,N-bis(2-acetoxy ethyl)-2-(tetrahydrofurfuryloxycarbonyl)ethylamine, N,N-bis(2-hydroxyethyl)-2-[(2-oxotetrahydrofuran-3-yl)oxycarbonyl]ethylamine, N,N-bis(2-acetoxyethyl)-2-[(2-oxotetrahydrofuran-3-yl)oxycarbonyl]ethylamine, N,N-bis(2-hydroxyethyl)-2-(4-hydroxybutoxycarbonyl)ethylamine, N,N-bis(2-formyloxyethyl)-2-(4-formyloxybutoxycarbonyl)ethylamine, N,N-bis(2-formyloxyethyl)-2-(2-formyloxyethoxycarbonyl)ethylamine, N,N-bis(2-methoxyethyl)-2-(methoxycarbonyl)ethylamine, N-(2-hydroxyethyl)bis[2-(methoxycarbonyl)ethyl]amine, N-(2-acetoxyethyl)bis[2-(methoxycarbonyl)ethyl]amine, N-(2-hydroxyethyl)bis[2-(ethoxycarbonyl)ethyl]amine, N-(2-acetoxyethyl)bis[2-(ethoxycarbonyl)ethyl]amine, N-(3-hydroxy-1-propyl)bis [2-(methoxycarbonyl)ethyl]amine, N-(3-acetoxy-1-propyl) bis [2-(methoxycarbonyl)ethyl]amine, N-(2-methoxyethyl) bis [2-(methoxycarbonyl)ethyl]amine, N-butylbis [2-(methoxycarbonyl)ethyl]amine, N-butylbis [2-(2-methoxyethoxycarbonyl)ethyl]amine, N-methylbis(2-acetoxyethyl)amine, N-ethylbis(2-acetoxyethyl)amine, N-methylbis(2-pivaloyloxyethyl)amine, N-ethylbis[2-(methoxycarbonyloxy)ethyl]amine, N-ethylbis[2-(tert-butoxycarbonyloxy)ethyl]amine, tris(methoxycarbonylmethyl)amine, tris(ethoxycarbonylmethyl)amine, N-butylbis (methoxycarbonylmethyl)amine, N-hexylbis (methoxycarbonylmethyl)amine, and β-(diethylamino)-δ-valerolactone.

The basic compounds may be used alone or in admixture of two or more. The basic compound (E) may be formulated in an amount of 0 to 3 parts by weight per 100 parts by weight of component (A). From the standpoint of sensitivity, the amount of the basic compound is preferably 0.01 to 2 parts, more preferably 0.05 to 1 part by weight.

Other Additives

Besides the aforementioned components, the photosensitive resin composition may include optional additives. A typical additive is a surfactant which is commonly used for improving the coating characteristics.

Preferred surfactants are nonionic surfactants, for example, fluorochemical surfactants such as perfluoroalkyl polyoxyethylene ethanols, fluorinated alkyl esters, perfluoroalkylamine oxides, and fluorinated organosiloxane compounds. These surfactants are commercially available. Illustrative examples include Fluorad® FC-430 from 3M, Surflon® S-141 and S-145 from AGC Seimi Chemical Co., Ltd., Unidyne® DS-401, DS-4031, and DS-451 from Daikin Industries Ltd., Megaface® F-8151 from DIC Corp., and X-70-093 from Shin-Etsu Chemical Co., Ltd. Preferred surfactants are Fluorad FC-430 and X-70-093. The surfactant is preferably used in an amount of 0.05 to 1 part by weight per 100 parts by weight of component (A).

The photosensitive resin composition may contain a silane coupling agent, which is effective for further increasing the adhesion of a resin coating of the resin composition to an adherend. Suitable silane coupling agents include epoxy-containing silane coupling agents and aromatic group-containing aminosilane coupling agents. The silane coupling agent may be used alone or in admixture. Although the amount of the silane coupling agent used is not particularly limited, it is preferably 0.01 to 5% by weight of the resin composition.

The photosensitive resin composition of the invention is prepared in any desired way. For example, it may be prepared by agitating and mixing the aforementioned components and optionally passing the mixture through a filter.

The photosensitive resin composition is advantageously used, for example, as resist material for photolithography, film-forming material for semiconductor device protective film, interconnection protective film, coverlay film, solder mask, and TSV dielectric film, and adhesive between substrates in three-dimensional laminates.

Pattern Forming Process Using Photosensitive Resin Composition

A further embodiment of the invention is a pattern forming process comprising the steps of:

(i) coating the photosensitive resin composition onto a substrate to form a photosensitive resin coating thereon, (ii) exposing a predetermined region of the photosensitive resin coating to radiation through a photomask and post-exposure baking, and (iii) developing the photosensitive resin coating as baked in a developer to dissolve away the unexposed region of the resin coating and to form a pattern of the resin coating.

First, in step (i), the photosensitive resin composition is coated onto a substrate to form a photosensitive resin coating thereon. Examples of the substrate include silicon wafers, TSV silicon wafers, silicon wafers which have been thinned by back side polishing, plastic substrates, ceramic substrates, and substrates having a metal coating of Ni or Au wholly or partly on the surface by ion sputtering or plating. Also useful are substrates having grooves and/or holes having an opening width of 10 to 100 μm and a depth of 10 to 120 μm.

The coating technique may be dipping, spin coating, roll coating or the like. The coating weight may be selected as appropriate for a particular purpose, preferably so as to form a photosensitive resin coating having a thickness of 0.1 to 200 μm, more preferably 1 to 150 μm. A pre-wetting technique of dispensing a solvent dropwise on a substrate prior to coating of the resin composition may be employed for the purpose of making the coating thickness on the substrate more uniform. The type and amount of the solvent dispensed dropwise may be selected for a particular purpose. For example, alcohols such as isopropyl alcohol (IPA), ketones such as cyclohexanone, and glycols such as propylene glycol monomethyl ether are preferred. The solvent used in the photosensitive resin composition may also be used.

At this point, the coating may be prebaked to volatilize off the solvent and the like, if necessary, for efficient photo-cure reaction. Prebake may be performed, for example, at 40 to 140° C. for 1 minute to about 1 hour.

Next, in step (ii), a predetermined region of the photosensitive resin coating is exposed to radiation through a photomask. The exposure radiation is generally of wavelength 1 to 600 nm, preferably 10 to 600 nm, more preferably 190 to 500 nm. The photomask used herein may be, for example, one perforated with a desired pattern. Although the material of the photomask is not particularly limited, a material capable of shielding radiation in the above wavelength range, typically chromium is preferred. Examples of the radiation in the above wavelength range include radiation of various wavelengths from radiation-emitting units, specifically UV radiation such as g-line, h-line or i-line, and deep UV (248 nm, 193 nm). Among these, radiation of wavelength 248 to 436 nm is preferred. An appropriate exposure dose is 10 to 10,000 $mJ/cm^2$.

The next step may be post-exposure bake (PEB) which is effective for enhancing development sensitivity. PEB is preferably performed at 40 to 150° C. for 0.5 to 10 minutes. The exposed region of the resin coating is crosslinked by PEB to form an insolubilized pattern which is insoluble in an organic solvent as developer.

PEB is followed by the step (iii) of developing the exposed resin coating in a developer to dissolve away the unexposed region of the resin coating and to form a pattern of the resin coating. The preferred developers are organic solvents including alcohols such as IPA, ketones such as cyclohexanone, and glycols such as propylene glycol monomethyl ether. The solvent used in the photosensitive resin composition is also useful. Development is effected in a conventional manner, for example, by dipping the exposed coating in the developer. The development is followed by washing, rinsing and drying if necessary. In this way, a resin coating having the desired pattern is obtained.

In step (iv), the patterned coating may be post-cured in an oven or hot plate at a temperature of preferably 100 to 250° C., more preferably 150 to 220° C. The photosensitive resin composition ensures that a resin coating having improved film properties is obtained from post-cure even at a relatively low temperature around 200° C. A post-cure temperature in the range of 100 to 250° C. is effective for increasing the crosslinking density of the resin coating and removing any residual volatile matter. The resulting coating has augmented adhesion to substrates, heat resistance, mechanical strength, good electric properties, and bond strength. An appropriate post-cure time is 10 minutes to 10 hours, more preferably 10 minutes to 3 hours. The resin coating as post-cured has a thickness of 1 to 200 μm, preferably 5 to 50 μm. Through these steps, there is obtained the resin coating suited for the final purpose of protecting electric and electronic parts.

Although the pattern forming process has been described, it is sometimes unnecessary to form a pattern. When it is simply desired to form a uniform film, for example, the same process as above may be followed except that in step (ii), the resin coating is exposed to radiation of suitable wavelength directly, i.e., without the photomask.

Substrate Bonding Method

The photosensitive resin composition may be used as an adhesive (or substrate bonding material) for bonding two substrates. The substrate bonding method may be a method of joining a first substrate having a coating of the resin composition formed thereon to a second substrate under a sufficient set of temperature and pressure conditions to form an adhesive bond between the substrates. One or both of the first substrate having a resin coating and the second substrate may have been cut into a chip such as by dicing. The preferred bonding conditions include a temperature of 50 to 200° C. and a time of 1 to 60 minutes. Any desired bonding units may be used, for example, a wafer bonder for bonding wafers under reduced pressure and under a certain load, or a flip chip bonder for performing chip-wafer or chip-chip bonding. The adhesive layer between substrates may be subjected to post-cure treatment into a permanent bond having augmented bond strength.

The thus joined or bonded substrates may be post-cured under the same conditions as in the above step (iv), for thereby increasing the crosslinking density of the resin coating to enhance substrate bonding force. It is noted that crosslinking reaction occurs by the heat during bonding. Since this crosslinking reaction is not accompanied with side reaction entailing degassing, no bonding voids are induced when the photosensitive resin composition is used as the substrate adhesive.

Photosensitive Dry Film

A further embodiment of the invention is a photosensitive dry film comprising a support film and the photosensitive resin coating thereon.

The photosensitive dry film (support film+photosensitive resin coating) is solid, and the photosensitive resin coating contains no solvent. This eliminates the risk that bubbles resulting from volatilization of solvent are left within the resin coating and between the resin coating and the rugged substrate surface. An appropriate thickness range exists for the resin coating when planarity and step coverage on rugged substrate surface and a substrate lamination spacing are taken into account. It is preferred from the standpoints of planarity, step coverage, and substrate lamination spacing that the photosensitive resin coating have a thickness of 5 to 200 μm, more preferably 10 to 100 μm.

Furthermore, the viscosity and fluidity of the photosensitive resin coating are closely correlated. As long as the photosensitive resin coating has a proper range of viscosity, it exhibits a sufficient fluidity to fill deeply even in a narrow gap or it softens to enhance the adhesion to the substrate. Accordingly, from the standpoint of fluidity, the photosensitive resin coating should preferably have a viscosity in the range of 10 to 5,000 Pa·s, more preferably 30 to 2,000 Pa·s, and even more preferably 50 to 300 Pa·s at a temperature of 80 to 120° C. It is noted that the viscosity is measured by a rotational viscometer.

The photosensitive dry film has the advantage that when tightly attached to a substrate having asperities on its surface (e.g., a substrate having grooves and/or holes with an opening width of 10 to 100 μm and a depth of 10 to 120 μm), the photosensitive resin coating is coated so as to conform to the asperities, achieving high planarity. Since the photosensitive resin coating is characterized by low surface tension, higher planarity is achievable. Further, if the photosensitive resin coating is in close contact with the substrate in a vacuum environment, generation of gaps therebetween is effectively inhibited.

The photosensitive dry film may be manufactured by coating the photosensitive resin composition to a support and drying the resin composition into a resin coating. An apparatus for manufacturing the photosensitive dry film may be a film coater commonly used in the manufacture of pressure-sensitive adhesive products. Suitable film coaters include, for example, a comma coater, comma reverse coater, multiple coater, die coater, lip coater, lip reverse coater, direct gravure coater, offset gravure coater, three roll bottom reverse coater, and four roll bottom reverse coater.

The support film is unwound from a supply roll in the film coater, passed across the head of the film coater where the photosensitive resin composition is coated onto the support film to the predetermined buildup, and then moved through a hot air circulating oven at a predetermined temperature for a predetermined time, where the photosensitive resin coating is dried on the support film. Thereafter, the support film having the photosensitive resin coating thereon and a protective film which is unwound from another supply roll in the film coater are passed across a laminate roll under a predetermined pressure whereby the protective film is bonded to the photosensitive resin coating on the support film, whereupon the laminate (protective film-bearing photosensitive dry film) is wound up on a take-up shaft in the film coater. Preferably, the oven temperature is 25 to 150° C., the pass time is 1 to 100 minutes, and the bonding pressure is 0.01 to 5 MPa.

The support film used in the photosensitive dry film may be a single film or a multilayer film consisting of a plurality of stacked polymer layers. Examples of the film material include synthetic resins such as polyethylene, polypropylene, polycarbonate and polyethylene terephthalate (PET), with the PET film being preferred for appropriate flexibility, mechanical strength and heat resistance. These films may have been pretreated such as by corona treatment or coating of a release agent. Such films are commercially available, for example, Cerapeel® WZ(RX) and Cerapeel® BX8(R) from Toray Advanced Film Co., Ltd.; E7302 and E7304 from Toyobo Co., Ltd.; Purex® G31 and Purex® G71T1 from Teijin DuPont Films Japan Ltd.; and PET38x1-A3, PET38x1-V8 and PET38x1-X08 from Nippa Co., Ltd.

The protective film used in the photosensitive dry film may be similar to the support film. Among others, PET and polyethylene films having an appropriate flexibility are preferred. Such films are also commercially available. For example, PET films are as mentioned above, and polyethylene films include GF-8 from Tamapoly Co., Ltd. and PE film 0 type from Nippa Co., Ltd.

Both the support and protective films preferably have a thickness of 10 to 100 µm, more preferably 25 to 50 µm, for consistent manufacture of photosensitive dry film, and prevention of wrapping or curling on a take-up roll.

Pattern Forming Process Using Photosensitive Dry Film

A further embodiment of the invention is a pattern forming process comprising the steps of:

(i) attaching the photosensitive dry film at its photosensitive resin coating to a substrate to form the photosensitive resin coating thereon, (ii) exposing a predetermined region of the photosensitive resin coating to radiation through a photomask and post-exposure baking, (iii) developing the photosensitive resin coating as post-exposure baked in a developer to dissolve away the unexposed region of the resin coating and to form a pattern of the resin coating.

In step (i), the photosensitive dry film at its photosensitive resin coating is attached to a substrate after stripping the protective film, if any, from the dry film. The dry film may be attached using a film attachment apparatus.

The substrate may be the same as used in the pattern forming process using the photosensitive resin composition.

The film attachment apparatus is preferably a vacuum laminator. The photosensitive dry film is mounted in the film attachment apparatus where the protective film is stripped from the dry film. In the vacuum chamber kept at a predetermined vacuum, the bare photosensitive resin coating of the dry film is closely bonded to the substrate on a table at a predetermined temperature, using a bonding roll under a predetermined pressure. Preferably, the temperature is 60 to 120° C., the pressure is 0 to 5.0 MPa, and the vacuum is 50 to 500 Pa.

The attachment of dry film may be repeated plural times, if necessary to obtain a photosensitive resin coating having the desired thickness. The attachment step is repeated 1 to 10 times, for example, before a photosensitive resin coating having a thickness of the order of 10 to 1,000 µm, preferably 100 to 500 µm is obtained.

The assembly of the photosensitive resin coating on the substrate may be prebaked, if necessary, for facilitating photo-cure reaction of the photosensitive resin coating or enhancing the adhesion between the resin coating and the substrate. Prebake may be, for example, at 40 to 140° C. for 1 minute to 1 hour. Like the pattern forming process using the photosensitive resin composition, the photosensitive resin coating attached to the substrate may be subjected to steps of (ii) exposing a predetermined region of the photosensitive resin coating to radiation through a photomask and PEB, (iii) developing the photosensitive resin coating after PEB in a developer to dissolve away the unexposed region of the resin coating and to form a pattern of the resin coating, and optionally (iv) post-curing the patterned coating.

It is noted that the support film of the photosensitive dry film may be removed before prebake or before PEB, by mechanical stripping or the like, depending on a particular process.

The resin coating obtained from the photosensitive resin composition or photosensitive dry film has excellent properties including heat resistance, flexibility, electric insulation, mechanical properties, and substrate adhesion and is thus best suited as protective film for electric and electronic parts such as semiconductor devices and as substrate bonding film.

The pattern forming process using the photosensitive resin composition or photosensitive dry film is successful in readily forming a fine size pattern of thick film.

Laminate

A still further embodiment of the invention is a laminate comprising a substrate and a photosensitive resin coating formed thereon from the photosensitive resin composition or photosensitive dry film. The substrate may be a flat substrate as commonly used or a rugged substrate provided with grooves and/or holes having an opening width of 10 to 100 µm and a depth of 10 to 120 µm. The laminate is improved in adhesion between the substrate and the resin coating and provides high flatness even when the substrate is rugged.

EXAMPLE

Examples of the invention are given below by way of illustration and not by way of limitation. Notably, the weight average molecular weight (Mw) is measured by gel permeation chromatography (GPC) versus monodisperse polystyrene standards using GPC column TSKgel Super HZM-H (Tosoh Corp.) under analytical conditions: flow rate 0.6 mL/min, tetrahydrofuran elute, and column temperature 40° C. All parts are by weight (pbw).

Compounds (S-1) to (S-7) used in Examples and Comparative Examples are shown below.

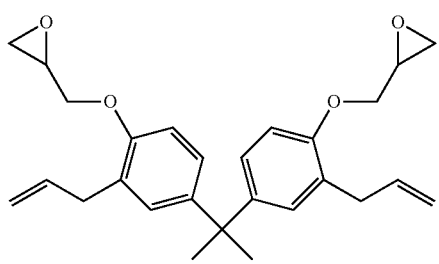 (S-1)

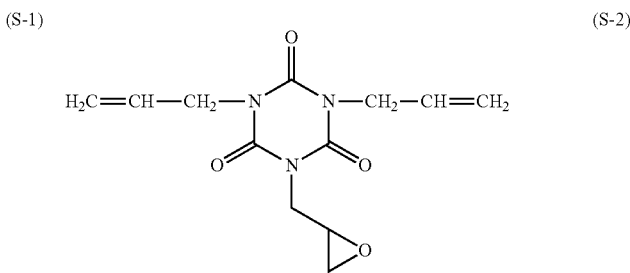 (S-2)

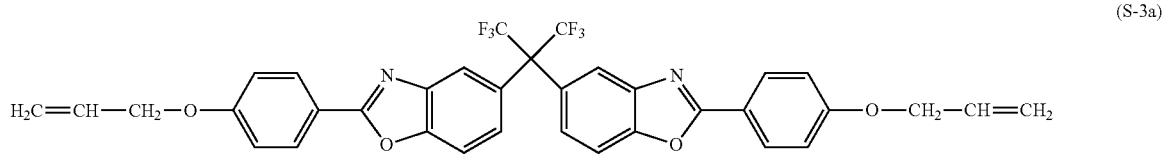 (S-3a)

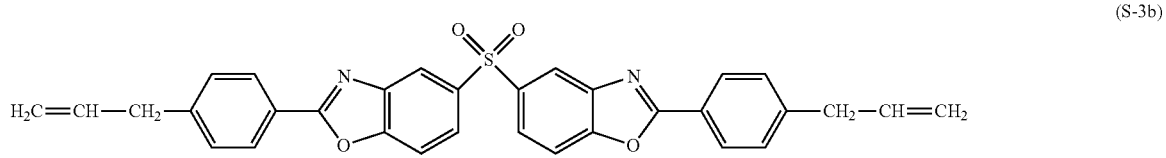 (S-3b)

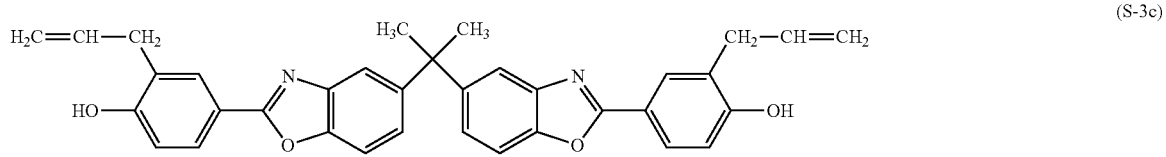 (S-3c)

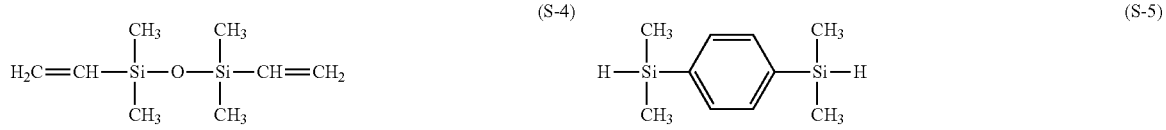 (S-4)

(S-5)

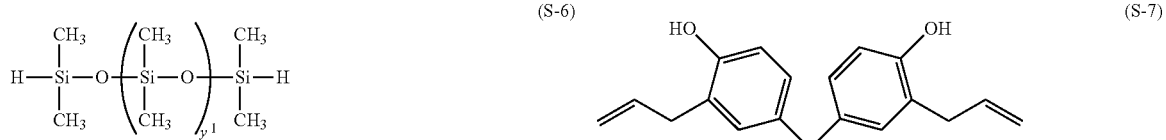 (S-6)

(S-7)

[1] Synthesis of Siloxane Structure-Containing Polymers

Example 1

Synthesis of Resin 1

A 3-L flask equipped with a stirrer, thermometer, nitrogen purge line and reflux condenser was charged with 19.6 g (0.05 mol) of Compound (S-1), 13.3 g (0.05 mol) of Compound (S-2), 162.5 g (0.25 mol) of Compound (S-3a), and 64.5 g (0.15 mol) of Compound (S-7), further with 2,000 g of toluene, and heated at 70° C. Thereafter, 1.0 g of a toluene solution of chloroplatinic acid (platinum concentration 0.5 wt %) was added, and 58.2 g (0.30 mol) of Compound (S-5) and 604.0 g (0.20 mol) of Compound (S-6) wherein $y^1=40$ (Shin-Etsu Chemical Co., Ltd.) were added dropwise over 1 hour. The molar ratio of the total amount of hydrosilyl groups to the total amount of alkenyl groups was 1/1. At the end of dropwise addition, the reaction solution was heated at 100° C. and aged for 6 hours. Toluene was distilled off in vacuum from the reaction solution, yielding Resin 1. On $^1$H—NMR and $^{29}$Si—NMR spectroscopy (Bruker Corp.), Resin 1 was identified to contain recurring units having formulae (a1) to (a4) and (b1) to (b4). On GPC analysis, it was confirmed that the peaks assigned to the reactants had disappeared, proving that a polymer corresponding to the charge ratio was synthesized. Resin 1 had a Mw of 42,000 and a silicone content of 65.5 wt %.

Example 2

Synthesis of Resin 2

A 3-L flask equipped with a stirrer, thermometer, nitrogen purge line and reflux condenser was charged with 19.6 g (0.05 mol) of Compound (S-1), 13.3 g (0.05 mol) of Compound (S-2), 133.0 g (0.25 mol) of Compound (S-3b), and 64.5 g (0.15 mol) of Compound (S-7), further with 2,000 g of toluene, and heated at 70° C. Thereafter, 1.0 g of a toluene solution of chloroplatinic acid (platinum concentration 0.5 wt %) was added, and 58.2 g (0.30 mol) of Compound (S-5) and 604.0 g (0.20 mol) of Compound (S-6) wherein $y^1=40$ (Shin-Etsu Chemical Co., Ltd.) were added dropwise over 1 hour. The molar ratio of the total amount of hydrosilyl groups to the total amount of alkenyl groups was 1/1.

At the end of dropwise addition, the reaction solution was heated at 100° C. and aged for 6 hours. Toluene was distilled off in vacuum from the reaction solution, yielding Resin 2.

On $^1$H—NMR and $^{29}$Si—NMR spectroscopy (Bruker Corp.), Resin 2 was identified to contain recurring units having formulae (a1) to (a4) and (b1) to (b4). On GPC analysis, it was confirmed that the peaks assigned to the reactants had disappeared, proving that a polymer corresponding to the charge ratio was synthesized. Resin 2 had a Mw of 43,000 and a silicone content of 67.7 wt %.

Example 3

Synthesis of Resin 3

A 3-L flask equipped with a stirrer, thermometer, nitrogen purge line and reflux condenser was charged with 19.6 g (0.05 mol) of Compound (S-1), 13.3 g (0.05 mol) of Compound (S-2), 135.5 g (0.25 mol) of Compound (S-3c), and 64.5 g (0.15 mol) of Compound (S-7), further with 2,000 g of toluene, and heated at 70° C. Thereafter, 1.0 g of a toluene solution of chloroplatinic acid (platinum concentration 0.5 wt %) was added, and 58.2 g (0.30 mol) of Compound (S-5) and 604.0 g (0.20 mol) of Compound (S-6) wherein $y^1$=40 (Shin-Etsu Chemical Co., Ltd.) were added dropwise over 1 hour. The molar ratio of the total amount of hydrosilyl groups to the total amount of alkenyl groups was 1/1. At the end of dropwise addition, the reaction solution was heated at 100° C. and aged for 6 hours. Toluene was distilled off in vacuum from the reaction solution, yielding Resin 3. On $^1$H—NMR and $^{29}$Si—NMR spectroscopy (Bruker Corp.), Resin 3 was identified to contain recurring units having formulae (a1) to (a4) and (b1) to (b4). On GPC analysis, it was confirmed that the peaks assigned to the reactants had disappeared, proving that a polymer corresponding to the charge ratio was synthesized. Resin 3 had a Mw of 42,000 and a silicone content of 67.5 wt %.

Example 4

Synthesis of Resin 4

A 3-L flask equipped with a stirrer, thermometer, nitrogen purge line and reflux condenser was charged with 39.2 g (0.10 mol) of Compound (S-1), 26.5 g (0.10 mol) of Compound (S-2), 32.5 g (0.05 mol) of Compound (S-3a), 9.3 g (0.05 mol) of Compound (S-4), and 86.0 g (0.20 mol) of Compound (S-7), further with 2,000 g of toluene, and heated at 70° C. Thereafter, 1.0 g of a toluene solution of chloroplatinic acid (platinum concentration 0.5 wt %) was added, and 58.2 g (0.30 mol) of Compound (S-5) and 317.0 g (0.20 mol) of Compound (S-6) wherein $y^1$=20 (Shin-Etsu Chemical Co., Ltd.) were added dropwise over 1 hour. The molar ratio of the total amount of hydrosilyl groups to the total amount of alkenyl groups was 1/1. At the end of dropwise addition, the reaction solution was heated at 100° C. and aged for 6 hours. Toluene was distilled off in vacuum from the reaction solution, yielding Resin 4. On $^1$H—NMR and $^{29}$Si—NMR spectroscopy (Bruker Corp.), Resin 4 was identified to contain recurring units having formulae (a1) to (a5) and (b1) to (b5). On GPC analysis, it was confirmed that the peaks assigned to the reactants had disappeared, proving that a polymer corresponding to the charge ratio was synthesized. Resin 4 had a Mw of 43,000 and a silicone content of 55.7 wt %.

Example 5

Synthesis of Resin 5

A 3-L flask equipped with a stirrer, thermometer, nitrogen purge line and reflux condenser was charged with 39.2 g (0.10 mol) of Compound (S-1), 26.5 g (0.10 mol) of Compound (S-2), 26.6 g (0.05 mol) of Compound (S-3b), 9.3 g (0.05 mol) of Compound (S-4), and 86.0 g (0.20 mol) of Compound (S-7), further with 2,000 g of toluene, and heated at 70° C. Thereafter, 1.0 g of a toluene solution of chloroplatinic acid (platinum concentration 0.5 wt %) was added, and 58.2 g (0.30 mol) of Compound (S-5) and 317.0 g (0.20 mol) of Compound (S-6) wherein $y^1$=20 (Shin-Etsu Chemical Co., Ltd.) were added dropwise over 1 hour. The molar ratio of the total amount of hydrosilyl groups to the total amount of alkenyl groups was 1/1. At the end of dropwise addition, the reaction solution was heated at 100° C. and aged for 6 hours. Toluene was distilled off in vacuum from the reaction solution, yielding Resin 5. On $^1$H—NMR and $^{29}$Si—NMR spectroscopy (Bruker Corp.), Resin 5 was identified to contain recurring units having formulae (a1) to (a5) and (b1) to (b5). On GPC analysis, it was confirmed that the peaks assigned to the reactants had disappeared, proving that a polymer corresponding to the charge ratio was synthesized. Resin 5 had a Mw of 45,000 and a silicone content of 56.3 wt %.

Example 6

Synthesis of Resin 6

A 3-L flask equipped with a stirrer, thermometer, nitrogen purge line and reflux condenser was charged with 39.2 g (0.10 mol) of Compound (S-1), 26.5 g (0.10 mol) of Compound (S-2), 27.1 g (0.05 mol) of Compound (S-3c), 9.3 g (0.05 mol) of Compound (S-4), and 86.0 g (0.20 mol) of Compound (S-7), further with 2,000 g of toluene, and heated at 70° C. Thereafter, 1.0 g of a toluene solution of chloroplatinic acid (platinum concentration 0.5 wt %) was added, and 58.2 g (0.30 mol) of Compound (S-5) and 317.0 g (0.20 mol) of Compound (S-6) wherein $y^1$=20 (Shin-Etsu Chemical Co., Ltd.) were added dropwise over 1 hour. The molar ratio of the total amount of hydrosilyl groups to the total amount of alkenyl groups was 1/1. At the end of dropwise addition, the reaction solution was heated at 100° C. and aged for 6 hours. Toluene was distilled off in vacuum from the reaction solution, yielding Resin 6. On $^1$H—NMR and $^{29}$Si—NMR spectroscopy (Bruker Corp.), Resin 6 was identified to contain recurring units having formulae (a1) to (a5) and (b1) to (b5). On GPC analysis, it was confirmed that the peaks assigned to the reactants had disappeared, proving that a polymer corresponding to the charge ratio was synthesized. Resin 6 had a Mw of 44,000 and a silicone content of 56.3 wt %.

Comparative Example 1

Synthesis of Resin 7

A 3-L flask equipped with a stirrer, thermometer, nitrogen purge line and reflux condenser was charged with 78.4 g (0.20 mol) of Compound (S-1), 39.8 g (0.15 mol) of Compound (S-2), and 64.5 g (0.15 mol) of Compound (S-7), further with 2,000 g of toluene, and heated at 70° C. Thereafter, 1.0 g of a toluene solution of chloroplatinic acid (platinum concentration 0.5 wt %) was added, and 58.2 g (0.30 mol) of Compound (S-5) and 604.0 g (0.20 mol) of Compound (S-6) wherein $y^1$=40 (Shin-Etsu Chemical Co., Ltd.) were added dropwise over 1 hour. The molar ratio of the total amount of hydrosilyl groups to the total amount of alkenyl groups was 1/1. At the end of dropwise addition, the reaction solution was heated at 100° C. and aged for 6 hours. Toluene was distilled off in vacuum from the reaction solution, yielding Resin 7. Resin 7 had a Mw of 42,000 and a silicone content of 71.5 wt %.

Comparative Example 2

Synthesis of Resin 8

A 3-L flask equipped with a stirrer, thermometer, nitrogen purge line and reflux condenser was charged with 58.8 g (0.15 mol) of Compound (S-1), 26.5 g (0.10 mol) of Compound (S-2), 9.3 g (0.05 mol) of Compound (S-4), and 86.0 g (0.20 mol) of Compound (S-7), further with 2,000 g of toluene, and heated at 70° C. Thereafter, 1.0 g of a toluene solution of chloroplatinic acid (platinum concentration 0.5 wt %) was added, and 58.2 g (0.30 mol) of Compound (S-5) and 317.0 g (0.20 mol) of Compound (S-6) wherein $y^1$=20 (Shin-Etsu Chemical Co., Ltd.) were added dropwise over 1 hour. The molar ratio of the total amount of hydrosilyl groups to the total amount of alkenyl groups was 1/1. At the end of dropwise addition, the reaction solution was heated at 100° C. and aged for 6 hours. Toluene was distilled off in vacuum from the reaction solution, yielding Resin 8. Resin 8 had a Mw of 45,000 and a silicone content of 57.0 wt %.

[2] Preparation of Photosensitive Resin Compositions

Examples 7 to 17 and Comparative Examples 3 to 4

Photosensitive resin compositions were prepared by combining the resin (Resins 1 to 8), photoacid generator, crosslinker, solvent, and basic compound in accordance with the formulation shown in Table 1, agitating them at room temperature until dissolution, and precision filtering through a Teflon® filter with a pore size of 1.0 μm.

TABLE 1

| Component (pbw) | Example | | | | | | | | | | | Comparative Example | |
|---|---|---|---|---|---|---|---|---|---|---|---|---|---|
| | 7 | 8 | 9 | 10 | 11 | 12 | 13 | 14 | 15 | 16 | 17 | 3 | 4 |
| (A) Resin 1 | 100 | | | | | | | | | | | | |
| Resin 2 | | 100 | | | | | | | | | | | |
| Resin 3 | | | 100 | | | | 100 | 100 | 100 | 100 | 100 | | |
| Resin 4 | | | | 100 | | | | | | | | | |
| Resin 5 | | | | | 100 | | | | | | | | |
| Resin 6 | | | | | | 100 | | | | | | | |
| Resin 7 | | | | | | | | | | | | 100 | |
| Resin 8 | | | | | | | | | | | | | 100 |
| (B) PAG-1 | 1 | 1 | 1 | 1 | 1 | 1 | 1 | 0.1 | 10 | 1 | 1 | 1 | 1 |
| (C) CL-1 | 10 | 10 | 10 | 10 | 10 | 10 | 10 | 10 | 10 | 25 | 1 | 10 | 10 |
| CL-2 | 3 | 3 | 3 | 3 | 3 | 3 | 3 | 3 | 3 | 35 | 1 | 3 | 3 |
| (D) cyclopentanone | 55 | 55 | 55 | 55 | 55 | 55 | 55 | 55 | 55 | 55 | 55 | 55 | 55 |
| (E) AM-1 | | | | | | | 0.1 | | | | | | |

In Table 1, photoacid generator PAG-1, crosslinkers CL-1 and CL-2, and basic compound AM-1 are identified below.

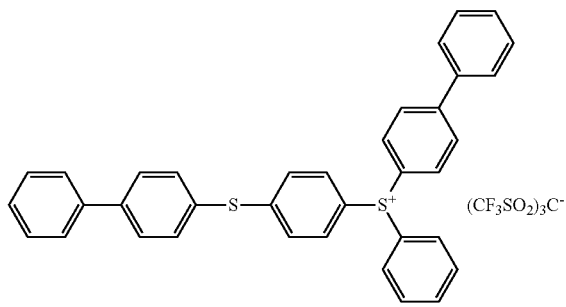

PAG-1

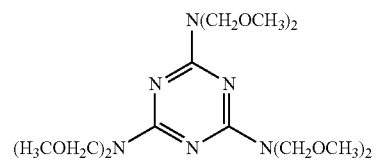

CL-1

CL-2

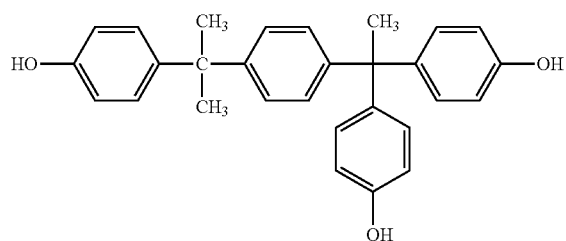

AM-1

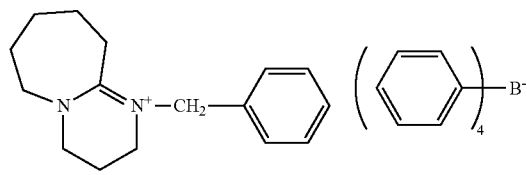

[3] Preparation of Photosensitive Dry Film

A die coater was used as the film coater and a polyethylene terephthalate (PET) film of 38 μm thick used as the support film. Each of the photosensitive resin compositions in Table 1 was coated onto the support film. The coated film was passed through a hot air circulating oven (length 4 m) set at 100° C. over 5 minutes to form a photosensitive resin coating on the support film, yielding a photosensitive dry film. Using a laminating roll, a polyethylene film of 50 μm thick as the protective film was bonded to the photosensitive resin coating under a pressure of 1 MPa, yielding a protective film-bearing photosensitive dry film. The thickness of each photosensitive resin coating is tabulated in Table 2. The thickness of a resin coating was measured by an optical interference film thickness gauge.

[4] Evaluation of Resin Coating (1) Pattern Formation and Evaluation

From the protective film-bearing photosensitive dry film, the protective film was stripped off. Using a vacuum laminator TEAM-100RF (Takatori Corp.) with a vacuum chamber set at a vacuum of 80 Pa, the photosensitive resin coating on the support film was closely bonded to a migration test substrate (comb-shaped electrode-bearing substrate, conductor: copper, conductor spacing and width: 20 μm, conductor thickness: 4 μm). The temperature was 110° C. After restoration of atmospheric pressure, the substrate was taken out of the laminator, and the support film was stripped off. Then the photosensitive resin coating was prebaked on a hot plate at 130° C. for 5 minutes for enhancing adhesion to the substrate.

Next, using a contact aligner exposure tool, the photosensitive resin coating was exposed to radiation of 405 nm through a mask having a line-and-space pattern and a contact hole pattern. After exposure, the coated substrate was baked (PEB) on a hot plate at 120° C. for 5 minutes and cooled. This was followed by spray development in propylene glycol monomethyl ether acetate (PGMEA) for 300 seconds for forming a pattern of the resin coating.

The patterned photosensitive resin coating on the substrate was post-cured in an oven at 180° C. for 2 hours while the oven was purged with nitrogen. Under a scanning electron microscope (SEM), the contact hole patterns of 100 μm, 80 μm, 60 μm, 40 μm, and 20 μm were observed in cross section, with the minimum hole pattern in which holes extended down to the film bottom being reported as maximum resolution. From the cross-sectional photo, the contact hole pattern of 80 μm was evaluated for perpendicularity, and rated excellent (⊚) for perpendicular pattern, good (O) for slightly inversely tapered profile, fair (Δ) for inversely tapered profile, and poor (X) for opening failure.

(2) Evaluation of Electric Properties (Dielectric Breakdown Strength)

For the evaluation of dielectric breakdown strength of a photosensitive resin coating of a photosensitive resin composition, each of the photosensitive resin compositions in Table 1 was coated onto a steel plate of 13 cm×15 cm×0.7 mm (thick) by means of a bar coater and heated in an oven at 180° C. for 2 hours to form a photosensitive resin coating.

The resin composition was coated such that the resulting coating had a thickness of 0.2 μm. The resin coating was tested by a breakdown tester TM-5031AM (Tama Densoku Co., Ltd.) to determine the dielectric breakdown strength thereof (3) Evaluation of Reliability (Adhesion, Crack Resistance)

Each of the photosensitive resin film-bearing wafers after pattern formation and post-cure in Examples 7 to 17 and Comparative Examples 3 to 4 was cut into specimens of 10 mm squares using a dicing saw with a dicing blade (DAD685 by DISCO Co., spindle revolution 40,000 rpm, cutting rate 20 mm/sec). Ten specimens for each Example were examined by a thermal cycling test (test of holding at −25° C. for 10 minutes and holding at 125° C. for 10 minutes, the test being repeated 1,000 cycles). After the test, it was observed whether or not the resin film peeled from the wafer and whether or not the resin film cracked. The sample was rated "good" when all specimens did not peel or crack, "peeled" when one or more specimens peeled, and "cracked" when one or more specimens cracked.

(4) Evaluation of Heat Resistance

Prior to a heating test, the weight of a specimen (prepared in the above reliability evaluation) was measured. The specimen was held in an oven at 200° C. for 1,000 hours, taken out of the oven, and measured for weight again. The sample was rated good when the weight change before and after the test was less than 0.5%, and poor when the weight change before and after the test was equal to or more than 0.5%.

(5) Evaluation of Chemical Resistance

To examine the solvent resistance of a photosensitive resin coating, especially resistance to NMP which is frequently used in the fabrication of semiconductor devices, a pattern of 10 mm×10 mm was formed on a wafer from each composition by the same procedure as in (3) Evaluation of reliability. The pattern-bearing wafer was immersed in NMP at room temperature for 1 hour, after which it was examined for a film thickness change and outer appearance for evaluating chemical resistance. The sample was rated good (O) when no changes of film thickness and appearance were observed, and poor (X) when any film thickness increase and swell were observed.

The test results of the resin coatings of the photosensitive resin compositions in Table 1 are tabulated in Table 2.

TABLE 2

|  | Example | | | | | | | | | | | Comparative Example | |
| --- | --- | --- | --- | --- | --- | --- | --- | --- | --- | --- | --- | --- | --- |
|  | 7 | 8 | 9 | 10 | 11 | 12 | 13 | 14 | 15 | 16 | 17 | 3 | 4 |
| Resin coating thickness (μm) | 100.4 | 100.5 | 99.7 | 101.0 | 100.1 | 99.9 | 99.7 | 100.2 | 98.9 | 99.7 | 100.9 | 100.3 | 100.5 |
| Contact hole pattern profile | ○ | ○ | ○ | ○ | ○ | ○ | ⊚ | ○ | ○ | ○ | ○ | ○ | ○ |
| Maximum resolution (μm) | 80 | 80 | 80 | 80 | 80 | 80 | 60 | 60 | 100 | 100 | 80 | 100 | 100 |
| Dielectric breakdown strength (V/μm) | 530 | 540 | 555 | 495 | 550 | 565 | 585 | 505 | 565 | 570 | 580 | 540 | 575 |
| Reliability Adhesion | Good | Good | Good | Good | Good | Good | Good | Good | Good | Good | Good | Peeled | Peeled |
| Crack resistance | Good | Good | Good | Good | Good | Good | Good | Good | Good | Good | Good | Cracked | Cracked |
| Heat resistance | Good | Good | Good | Good | Good | Good | Good | Good | Good | Good | Good | Poor | Poor |
| Chemical resistance | ○ | ○ | ○ | ○ | ○ | ○ | ○ | ○ | ○ | ○ | ○ | ○ | ○ |

As is evident from the test results, the photosensitive resin compositions within the scope of the invention experience little film thickness loss, exhibit good resolution, i.e., sufficient properties as photosensitive material. The resin coatings obtained therefrom have improved electric properties (e.g., dielectric breakdown strength), heat resistance and chemical resistance, as well as improved adhesion and crack resistance after the thermal cycling test, and are thus useful as protective film for circuits and electronic parts. Thus photosensitive dry films having more reliability are available.

Japanese Patent Application No. 2017-153884 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A silicone structure-containing polymer comprising recurring units having the formula (a1) and recurring units having the formula (b1):

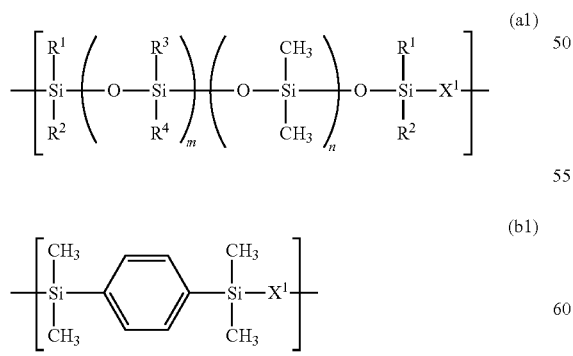

wherein $R^1$ to $R^4$ are each independently a $C_1$-$C_8$ monovalent hydrocarbon group, m and n are each independently an integer of 0 to 300, $X^1$ is a divalent group having the formula (1):

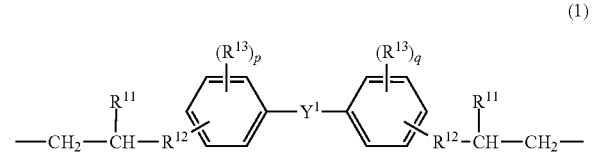

wherein $R^{11}$ is each independently hydrogen or a $C_1$-$C_8$ monovalent hydrocarbon group in which at least one hydrogen may be substituted by halogen, $R^{12}$ is each independently a $C_1$-$C_8$ straight, branched or cyclic alkylene group in which any methylene moiety may be substituted by an ether bond or phenylene moiety, $R^{13}$ is each independently hydrogen, a $C_1$-$C_8$ monovalent hydrocarbon group, hydroxyl group or glycidyl group, p and q are each independently an integer of 0 to 4, $Y^1$ is a divalent organic group having the formula (1-1), (1-2) or (1-3):

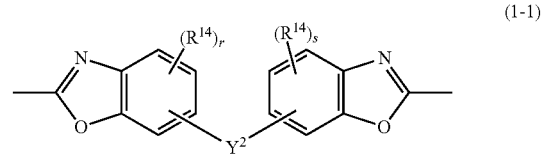

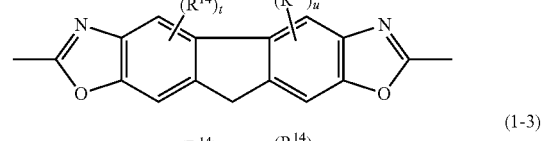

wherein $R^{14}$ is a $C_1$-$C_8$ monovalent hydrocarbon group in which at least one hydrogen may be substituted by halogen, $Y^2$ is a divalent organic group, r and s are each independently an integer of 0 to 3, t and u are each independently an integer of 0 to 2.

2. The silicone structure-containing polymer of claim 1 wherein $Y^2$ is a group selected from the following groups:

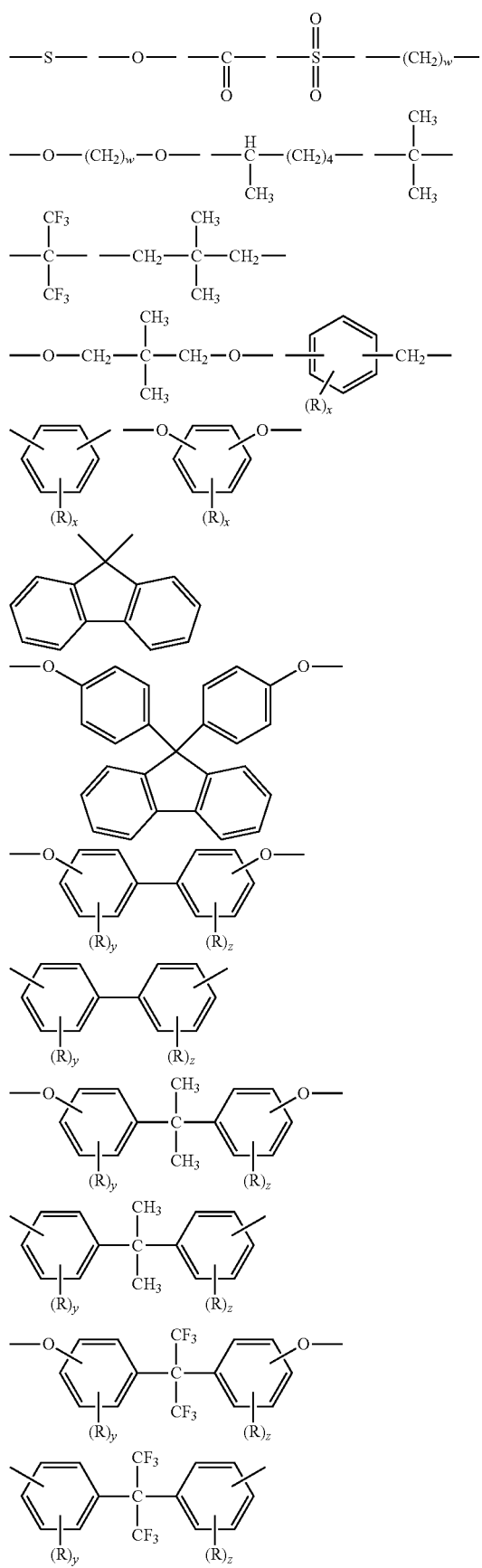

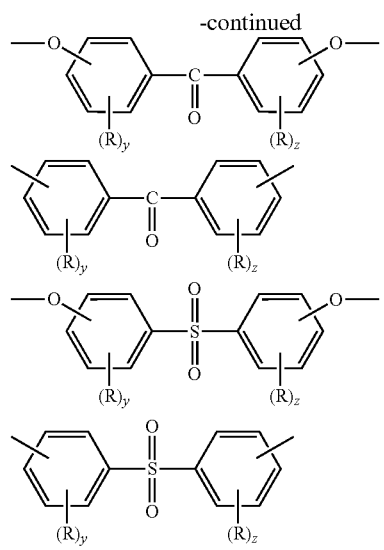

wherein R is each independently halogen, or a $C_1$-$C_8$ straight, branched or cyclic alkyl or haloalkyl group, w is an integer of 1 to 6, x is an integer of 0 to 4, and y and z are each independently an integer of 0 to 4.

3. The silicone structure-containing polymer of claim 1, further comprising recurring units having the formula (a2) and recurring units having the formula (b2):

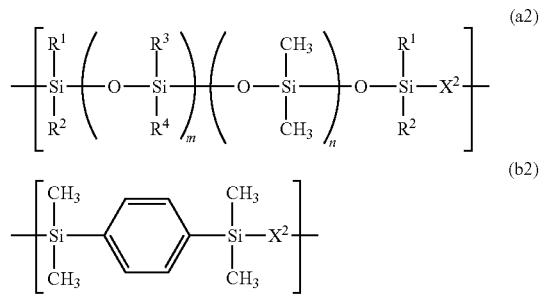

wherein $R^1$ to $R^4$, m and n are as defined above, $X^2$ is a divalent group having the formula (2):

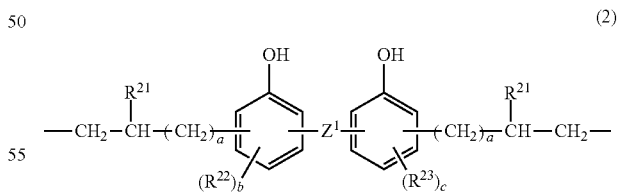

wherein $Z^1$ is a single bond or a divalent organic group selected from the following:

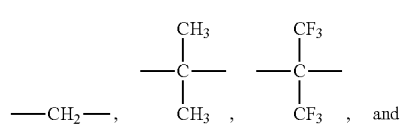

-continued

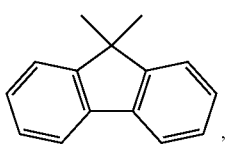, $R^{21}$ is each independently hydrogen or methyl, $R^{22}$ and $R^{23}$ are each independently a $C_1$-$C_4$ straight, branched or cyclic alkyl group or a $C_1$-$C_4$ straight, branched or cyclic alkoxy group, a is each independently an integer of 0 to 7, b and c are each independently an integer of 0 to 2.

4. The silicone structure-containing polymer of claim 1, further comprising recurring units having the formula (a3) and recurring units having the formula (b3):

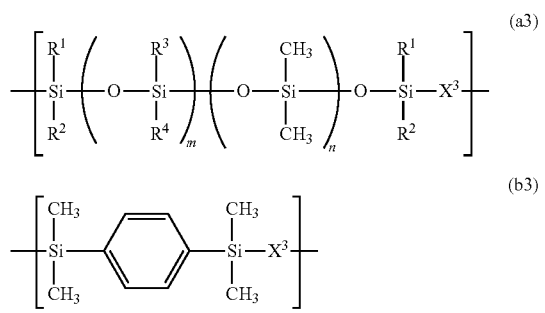

(a3)

(b3)

wherein $R^1$ to $R^4$, m and n are as defined above, $X^3$ is a divalent group having the formula (3):

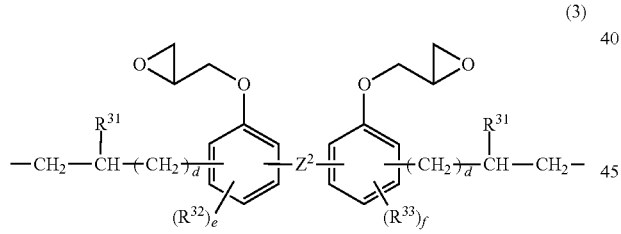

(3)

wherein $Z^2$ is a single bond or a divalent organic group selected from the following:

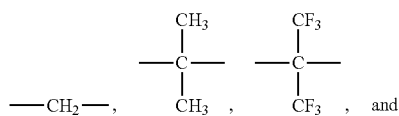

and

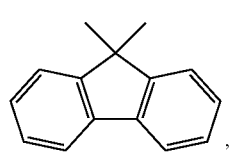, $R^{31}$ is each independently hydrogen or methyl, $R^{32}$ and $R^{33}$ are each independently a $C_1$-$C_4$ straight, branched or cyclic alkyl group or a $C_1$-$C_4$ straight, branched or cyclic alkoxy group, d is each independently an integer of 0 to 7, e and f are each independently an integer of 0 to 2.

5. The silicone structure-containing polymer of claim 1, further comprising recurring units having the formula (a4) and recurring units having the formula (b4):

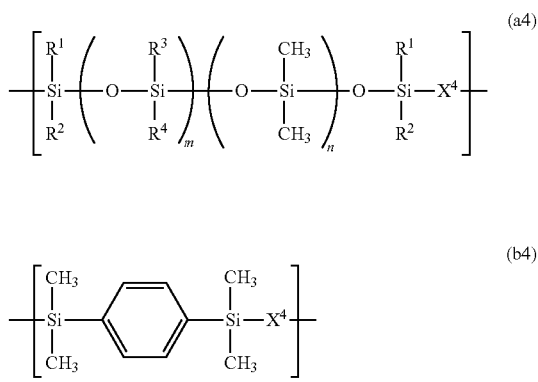

(a4)

(b4)

wherein $R^1$ to $R^4$, m and n are as defined above, $X^4$ is a divalent group having the formula (4):

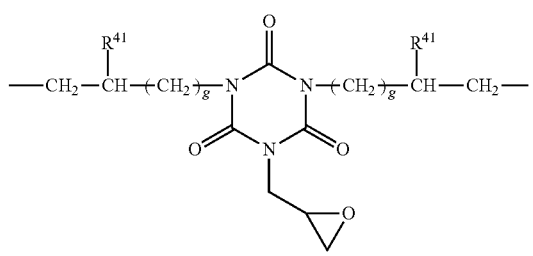

(4)

wherein $R^{41}$ is each independently hydrogen or methyl, and g is each independently an integer of 0 to 7.

6. The silicone structure-containing polymer of claim 1, further comprising recurring units having the formula (a5) and recurring units having the formula (b5):

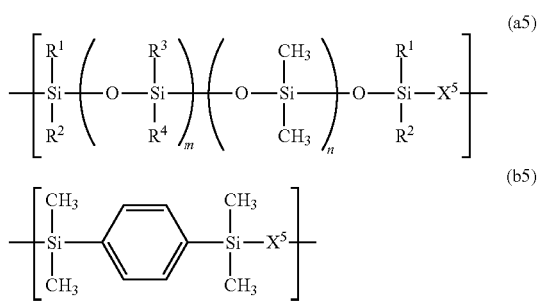

(a5)

(b5)

wherein $R^1$ to $R^4$, m and n are as defined above, $X^5$ is a divalent group having the formula (5):

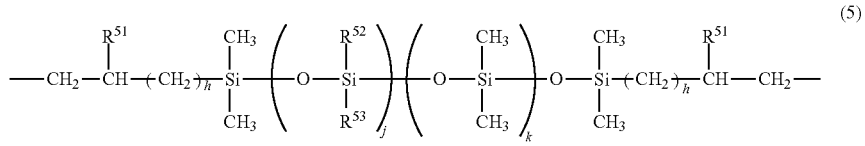
(5)

wherein $R^{51}$ is each independently hydrogen or methyl, $R^{52}$ and $R^{53}$ are each independently a $C_1$-$C_8$ monovalent hydrocarbon group, j and k are each independently an integer of 0 to 300, and h is each independently an integer of 0 to 7.

7. A photosensitive resin composition comprising (A) a base resin containing the silicone structure-containing polymer of claim 1 and (B) a photoacid generator.

8. The photosensitive resin composition of claim 7, further comprising (C) a crosslinker.

9. The photosensitive resin composition of claim 8 wherein the crosslinker (C) is at least one compound selected from the group consisting of an amino condensate modified with formaldehyde or formaldehyde-alcohol, a phenol compound having on the average at least two methylol or alkoxymethylol groups in the molecule, and an epoxy compound having on the average at least two epoxy groups in the molecule.

10. The photosensitive resin composition of claim 7, further comprising (D) a solvent.

11. The photosensitive resin composition of claim 7, further comprising (E) a basic compound.

12. A photosensitive resin coating formed of the photosensitive resin composition of claim 7.

13. A photosensitive dry film comprising a support film and the photosensitive resin coating of claim 12 thereon.

14. A laminate comprising a substrate having grooves and/or holes having an opening width of 10 to 100 μm and a depth of 10 to 120 μm and the photosensitive resin coating of claim 12 thereon.

15. A pattern forming process comprising the steps of:
(i) coating the photosensitive resin composition of claim 7 onto a substrate to form a photosensitive resin coating thereon,
(ii) exposing a predetermined region of the photosensitive resin coating to radiation through a photomask and post-exposure baking, and
(iii) developing the photosensitive resin coating as post-exposure baked in a developer to dissolve away the unexposed region of the resin coating and to form a pattern of the resin coating.

16. A pattern forming process comprising the steps of:
(i) attaching the photosensitive dry film of claim 13 at its photosensitive resin coating to a substrate to dispose the photosensitive resin coating thereon,
(ii) exposing a predetermined region of the photosensitive resin coating to radiation through a photomask and post-exposure baking, and
(iii) developing the photosensitive resin coating as post-exposure baked in a developer to dissolve away the unexposed region of the resin coating and to form a pattern of the resin coating.

17. The pattern forming process of claim 15, further comprising (iv) post-curing the patterned resin coating resulting from development step (iii) at a temperature of 100 to 250° C.

18. The pattern forming process of claim 15 wherein the substrate has grooves and/or holes having an opening width of 10 to 100 μm and a depth of 10 to 120 μm.

19. The photosensitive resin composition of claim 7 which is to form a coating for protecting electric and electronic parts.

20. The photosensitive resin composition of claim 7 which is to form a coating for bonding two substrates together.

* * * * *